United States Patent [19]

Inoue et al.

[11] Patent Number: 4,688,149
[45] Date of Patent: Aug. 18, 1987

[54] ELECTRICAL JUNCTION BOX

[75] Inventors: Nori Inoue, Yokkaichi; Yasuharu Moriai, Suzuka; Atushi Sakatani, Matsuzaka; Noriyuki Yoshida, Suzuka, all of Japan

[73] Assignees: Tokai Electric Wire Company, Ltd., Yokkaichi; Sumitomo Electric Industries, Ltd., Osaka, both of Japan

[21] Appl. No.: 912,688

[22] Filed: Sep. 26, 1986

Related U.S. Application Data

[63] Continuation of Ser. No. 483,557, Apr. 11, 1983, abandoned.

[30] Foreign Application Priority Data

| Apr. 15, 1982 | [JP] | Japan | 57-63007 |
| Feb. 14, 1983 | [JP] | Japan | 58-22624 |
| Feb. 14, 1983 | [JP] | Japan | 58-22625 |
| Feb. 14, 1983 | [JP] | Japan | 58-22627 |

[51] Int. Cl.⁴ .............................................. H05K 1/18
[52] U.S. Cl. ................................... 361/399; 361/407; 361/413; 439/449

[58] Field of Search ............ 339/17 J.C, 17 M, 17 N, 339/17 LM, 17 C, 103 R, 176 MP; 361/412, 413, 428, 395, 399, 407, 380, 397

[56] References Cited

U.S. PATENT DOCUMENTS

| 3,475,657 | 10/1969 | Knowles | 361/395 |
| 3,560,799 | 2/1971 | Bochicchio | 361/407 |
| 3,601,787 | 8/1971 | Reimer | 361/412 |
| 4,195,898 | 4/1980 | Chow | 339/103 R |
| 4,218,724 | 8/1980 | Kaufman | 361/412 |

Primary Examiner—G. P. Tolin
Attorney, Agent, or Firm—Harness, Dickey & Pierce

[57] ABSTRACT

An electrical junction system for automotive internal wiring has a wiring board provided with branching conductors formed by a multiplicity of bus bars on an insulation plate, the branching conductors being adapted to be connected to electric wires in a wiring harness to form branching electric circuits. The electrical junction system has a printed circuit board detachably mounted on the wiring board, the printed circuit board generally or inclusively carrying a plurality of circuits incorporating a multiplicity of function parts which are used semi-permanently such as relays and associated control elements.

1 Claim, 50 Drawing Figures

FIG. 28A
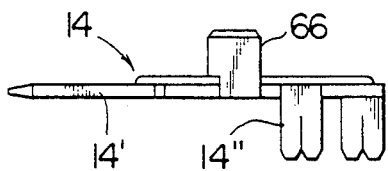
FIG. 28C  FIG. 28B
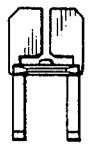 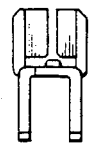
FIG. 28D
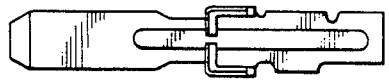
FIG. 28E
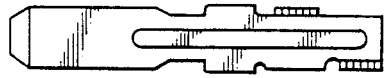

ELECTRICAL JUNCTION BOX

This application is a continuation of application Ser. No. 483,557, filed Apr. 11, 1983, now abandoned.

BACKGROUND OF THE INVENTION

1. Field of the Invention

The present invention relates to an improvement in an electrical junction system of the type which has a multiplicity of branching lines constituted by laying BUS bars and that is adapted for use in connecting electric lines in a wiring harness to constitute a branching circuit arrangement.

2. Description of the Prior Art

In general, a wiring harness used for internal electric wiring in automobiles requires a large number of branching circuits at an intermediate portion thereof. To cope with this demand, a known electrical junction system has been used in which the branching lines corresponding to the branching circuits of the wiring harness are concentrated to a wiring board by means of a BUS bar so that the desired electric circuit arrangement is built up in a concentrating manner by connecting the lines of the wiring harness to the branching line on the wiring board.

For instance, in an electrical junction system proposed hitherto, electronic circuits incorporating various relays having different functions such as an intermittent wiper relay, a fuel cut-off relay and so forth are formed in respective branching circuits. More specifically, control elements constituting each branching circuit, e.g. relays, capacitors, diodes and so forth are contained by an independent casing which is connected to suitable portion of the conductive part of bus bar through tab-like terminals provided on the casing.

In recent years, there is a tendency of upgrading of automobiles which in turn increases the number of electric devices used on the automobile, as well as higher quality and diversification of function of each electric device. On the other hand, there is an increasing demand for the improvement in the safety, driveability and comfort of automobiles. These demands naturally increases the number of the branching circuits in the wiring harness, as well as causing a remarkable increase in the diversification and number of electronic parts incorporated in each branching circuit.

The adoption of an electrical junction system of the relay unit type, therefore, encounters the following problems. Namely, the size of the electrical junction system of the relay unit type is inevitably increased to require a larger installation space which is difficult to find. The size increase is partly because of the increase in the number of relay units and partly because of the increased sizes of the relay units themselves. Another problem is that the productivity of the wiring harness is lowered due to the complication in the construction of the wire harness.

SUMMARY OF THE INVENTION

Accordingly, it is a primary object of the invention to provide a small-sized and compact electrical wiring system which can cope with the demand for upgrading of automobiles, thereby to obviate the above-described problems of the prior art.

To this end, according to an aspect of the invention, there is provided an electrical junction system having a wiring board provided with branching conductors formed by a multiplicity of bus bars on an insulation plate. The branching conductors are adapted to be connected to electric wires in a wiring harness to form branching electric circuits. In accordance with this aspect of the invention a printed circit board is detachably mounted on the wiring board. The printed ciruit board carries a plurality of conductors incorporating a multiplicity of function parts which are used semi-permanently such as relays and associated control elements.

Other objects, features and advantages of the invention will become clear from the following description of the preferred embodiments taken in conjunction with the accompanying drawings.

BRIEF DESCRIPTION OF THE DRAWINGS

FIGS. 28A to 28E are a front elevational view, right side elevational view, left side elevational view, top plan view and a bottom plan view, respectively, of a terminal incorporated in the seventh embodiment;

DESCRIPTION OF THE PREFERRED EMBODIMENTS

Before turning to the description of the preferred embodiments, an explanation will be made as to the state of the conventional art.

Figure 1:
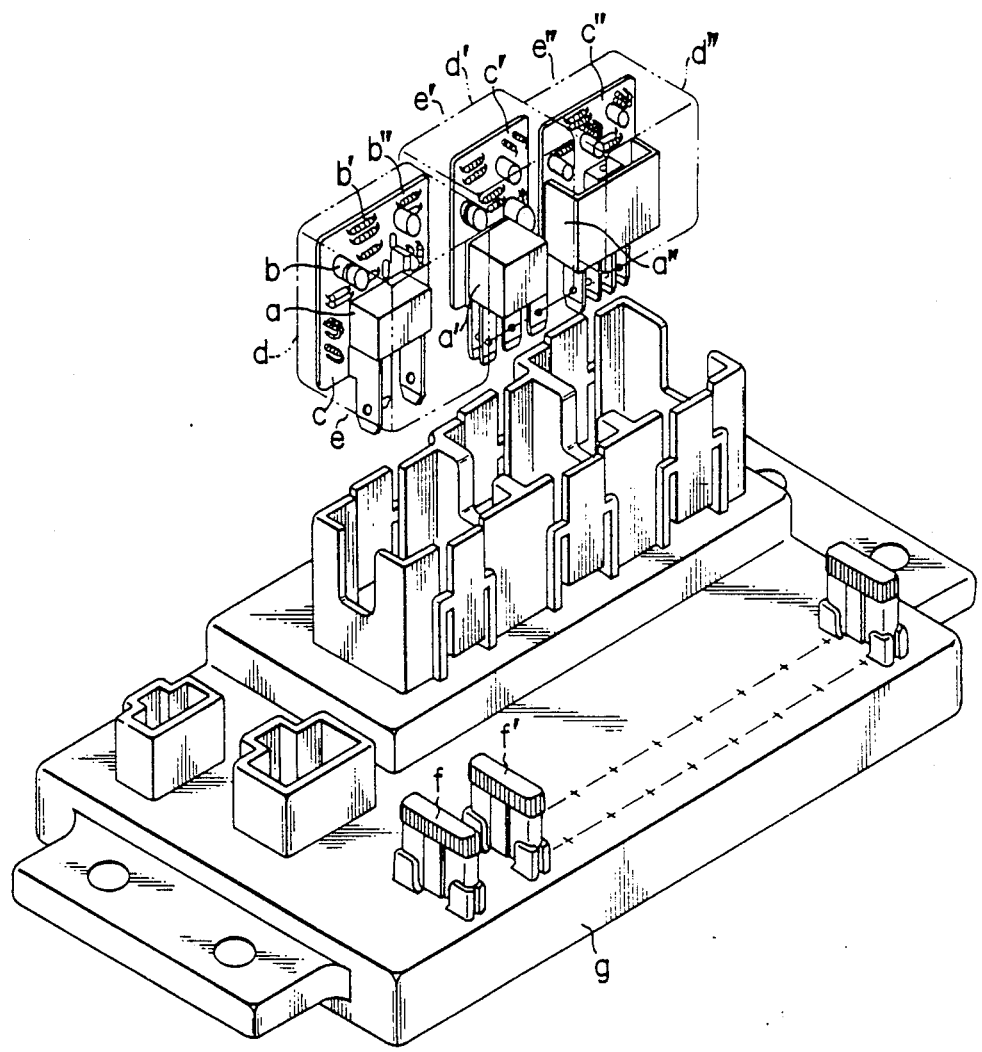
FIG. 1 is a partially exploded perspective view of a conventional prior art electrical junction system.
Figure 2:
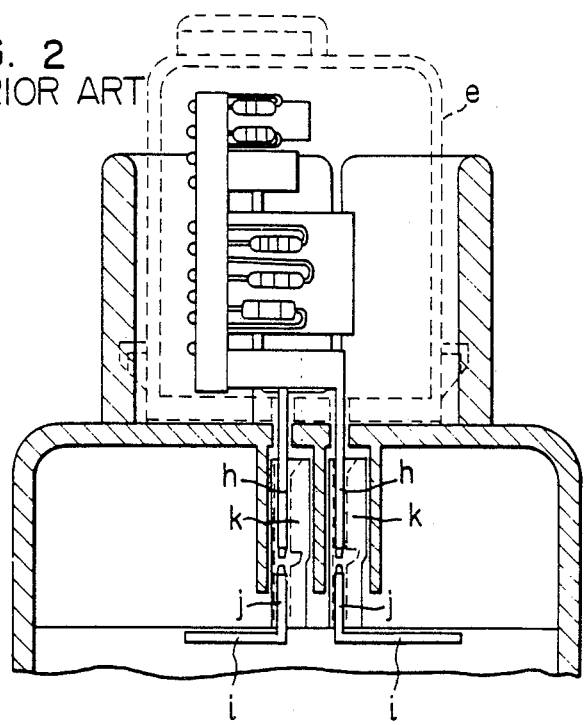
FIG. 2 is a sectional view illustrating the connection between a relay and a conductor of a bus bar in the electrical junction system shown in FIG. 1.
Figure 3C:
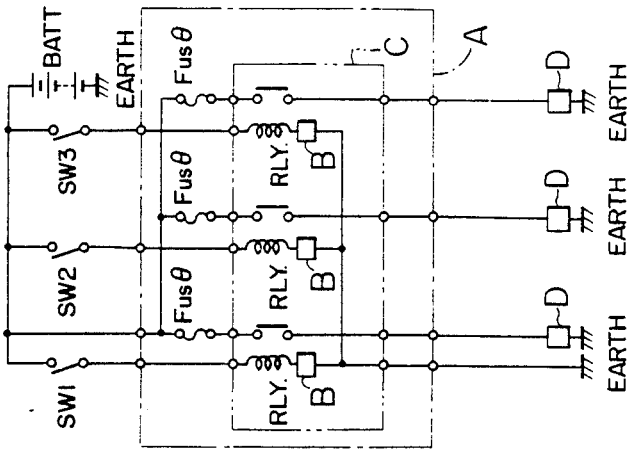
FIG. 3C shows an example of a circuit arrangement in which the above-mentioned relay circuit is combined with an electrical junction system in accordance with the invention.
Figure 3B:
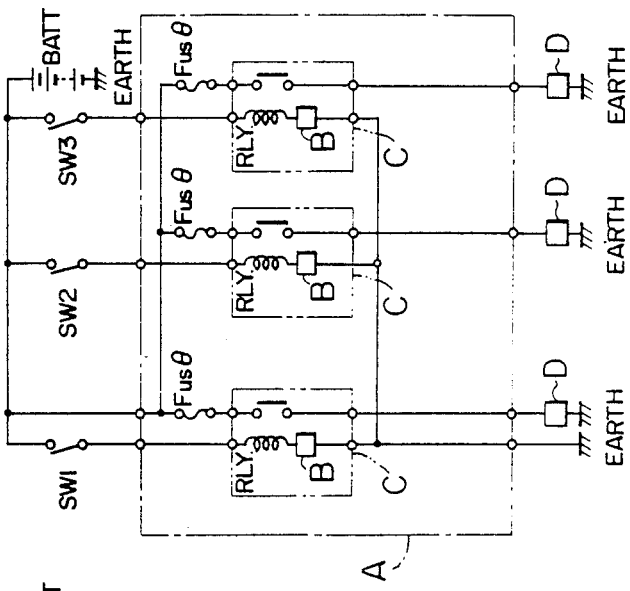
FIG. 3B shows an example of a prior art circuit arrangement in which the relay circuit mentioned above is combined with a conventional electrical junction system.
Figure 3A:
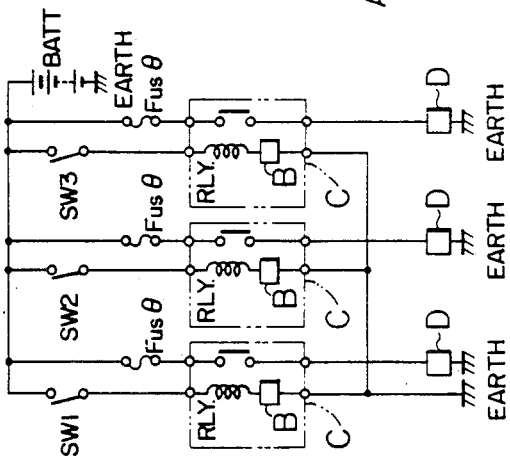
FIG. 3A shows an example of the conventional prior art circuit incorporating a relay, adopted in the circuit arrangement having no electrical junction system.

FIG. 3A shows a known circuit having various intermediates such as relays as may be arranged in wire harnesses. As shown in FIG. 3B, the junctions of the grounding side of the driving circuits for these relays and the junctions of the input sides of the load circuits for the relays are arranged on the bus bar conductors on a bus bar wiring board. This is done to reduce the number of the intermediate joints between the lines in each wire harness thereby to facilitate the production of the wiring harness. It has been attempted also to concentrate fuses to one portion of the circuit arrangement. The fuses are protective parts for the circuit and because they are replaceable the location is chosen to permit an easier maintenance of the fuses while shifting the junctions in the circuits protected by the fuses from the harnesses into the bus bar conductor. This is done so as to reduce the number of intermediate joints between the lines in each wire harness thereby to facilitate the assembling of the wiring harness. To these ends, hitherto, it has been a common measure to adopt the following arrangement. Namely, as shown in FIG. 1, various relays (a), (a') . . . , together with their associated control elements (b), (b') . . . such as transistors, diodes, capacitors, resistors and so forth are arranged on independent printed circuit boards (c), (c'), (c'') . . . and contained by independent cases (d), (d'), (d'') . . . to form independent relay units (e), (e'), (e'') and so on. At the same time, the blade type fuses are detachably mounted on an insulation box (g) constituting the outer housing of the electrical junction system. Then, as shown in FIG. 2, the tab-like terminals (h) of the relay time units (e), (e'), (e'') or the tab-like terminals of the blade type fuses (not shown) are conneced to the tab-like terminals (j) of the conductors (i) of the bus bar through an intermediate terminal member (k).

In FIGS. 3A and 3B, as well as in FIG. 3C which will be mentioned later, a symbol A represents a bus bar wiring board, B represents the relay control circuit, C represents a printed circuit board and (D) represents various loads. The circuits which are not on the bus bar wiring board A make use of electric wires as the conductors, while the circuits which are on the bus bar wiring board A but not on the printed wiring board C make use of the bus bar as the conductors. The conductors of the circuits of the printed wiring board C are constituted by copper foils.

The invention aims at providing a compact electrical junction system which occupies only a small space and employs a reduced number of parts, by improving the conventional electrical junction system explained hereinbefore.

According to the invention, there is provided an electrical junction system having the following features. Relays and associated control elements are incorporated in independent printed circuit boards and are contained by separate cases to form relay units. Each relay and the associated control elements are formed on a single printed circuit board. The junctions of the earth side of driving circuit of each relay, formed in the conventional arrangement in the conductors of bus bars as shown in FIG. 3B, are formed by copper foils on the printed circuit board C, to make it possible to reduce the number of contacts between the conductors of the printed circuit board C and those of the bus bar wiring board A. In addition, the junctions are concentrated in the printed circuit board C to a high density. Furthermore, it is possible to use a single common case for all relay units, instead of using independent relay units. According to the invention, therefore, it is possible to obtain a compact electrical junction system having reduced number of parts.

The invention will be more fully understood from the following description of the preferred embodiments.

Figure 4A:
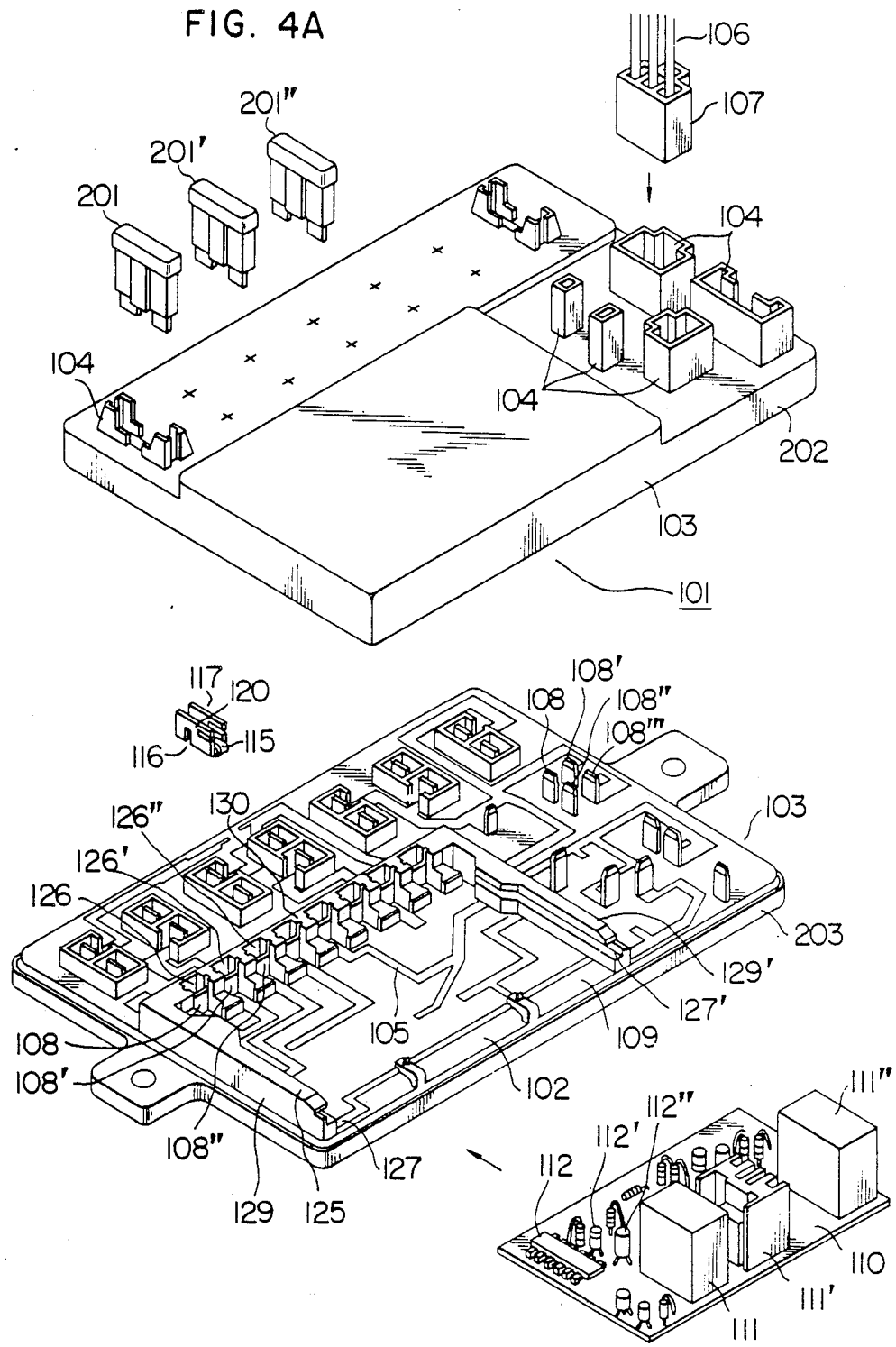
FIG. 4A is an exploded perspective view of the whole part of a first embodiment of the electrical junction system in accordance with the invention.

Referring first to FIG. 4A, this figure shows the whole portion of a first embodiment of the electrical junction system 101 of the invention. The electrical wiring system 101 has a bus bar wiring board 102 corresponding to the board (A) shown in FIG. 3B and accomodated by an insulation box 103 constituted by an upper case 202 and a lower case 203. Electric wires 106 in the wiring harnesses are connected, through connection ports 104 formed in the insulation box 103, to the bus bar conductors 105 which are formed by punching from a copper sheet and laid on the bus bar wiring board 102. Thus numerous branching circuits in the internal electric wiring of automobile are formed in a concentrated manner by the bus bar conductors 105 on the bus bar wiring board 102 within the box 103. The connection between the bus bar conductors 105 and the electric wires 106 of the wiring harness is achieved in a manner explained hereinunder.

Namely, various electrical devices are connected to or made to branch from one another through the electrical junction system 101. The ends of the electric wires 106 from various electric devices are sorted or grouped depending on the systems or wiring directions and are concentrated in respective connectors 107. On the other hand, the ends of the bus bar conductors 105 which are to be connected to the ends of the wires 106 concentrated in the connector 107 gather at a position suitable for the connection, and the connection is achieved through connection ports 104 which are formed in the portion of the insulation box corresponding to the position where the ends of the bus bar conductors 105 gather.

The ends of the bus bar conductors 105 protrude upright at the lower side of the connection ports 104 to form tab-like terminals 108, 108′, etc. while the ends of the wires 106 are connected to a terminal (not shown) having contact portions in the form of receptacles adapted to receive the tab-shaped terminals 108, 108′. The bus bar wiring board 102 consists of a plurality of layers, and the ends of the bus bar conductors on the underlying wiring board 102 project into the connection ports 104 through the thickness of the insulation plate 109 of the overlying bus bar wiring board 102.

Figure 4B:
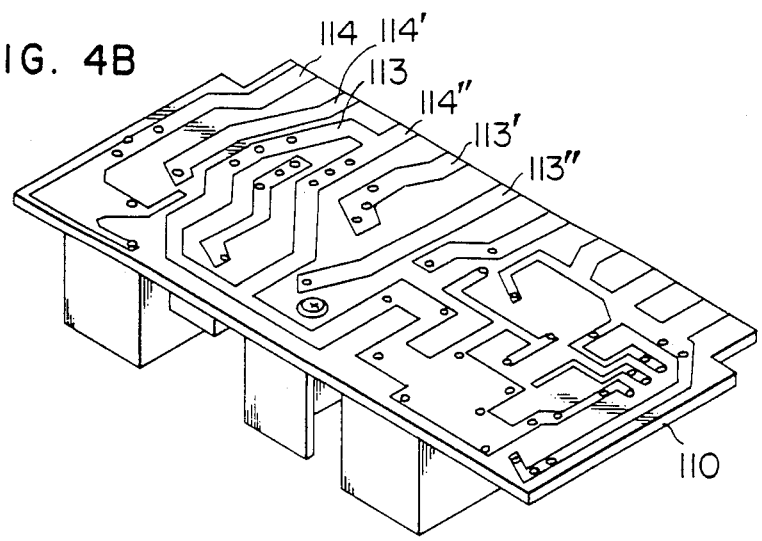
FIG. 4B is a perspective view of a printed circuit board shown in FIG. 4A as viewed from the rear side thereof.

A reference numeral 110 designates a printed circuit board (corresponds to (C) in FIG. 3C) which generally involves various conductors 113, 113′ (FIG. 4B) incorporating respective relays 111, 111′ etc. and associated control elements 112, 112′ etc. (correspond to (B) in FIGS. 3A to 3C). The conductors 113, 113′ are connected to the bus bar conductors 105 which in turn are connected to the electric wires 106. This arrangement will be more clearly understood from FIG. 4B which is a perspective view of the printed circuit board 110 shown in FIG. 4A as viewed from the reverse or under side thereof.

The printed circuit board 110 may have, besides the relays 111—111″ and associated control elements 112,112′ etc. (diodes, transistors, resistors, capacitors and so forth), conductors incorporating electronic parts mounted in the wire harness and used semi-permanently, e.g. diodes, transistors, resistors, capacitors and so forth. By so doing, it is possible to reduce the number of joints and the number of parts in the wiring harness.

On the other hand, the consumable circuit protective parts such as fuses 201,201′ are connected to the ends of the bus bar conductors 105 via intermediate terminal members (h) as in the case of the conventional circuit arrangement as shown in FIG. 2, in order to facilitate the maintenance, i.e. in such a manner as to permit an access for renewal from the outside of the insulation box 103. The conductors 113,113′ formed by copper foil on the printed circuit board 110 have terminals 114,114′ at which they are connected to the bus bar conductors 105. These terminals 114,114′ are arrayed on one side of the printed circuit board 110. The terminal portions 108,108′ of the bus bar conductors 105 which are to be connected to the terminals 114,114′ are disposed at positions convenient for the connection to corresponding terminals 114,114′.

More specifically, the connection between the terminals 108,108′ and the terminals 114,114′ is achieved by providing resilient contactors 115 on the terminals 108,108′ to contact the surfaces of the terminals 114,114′.

Figure 5:
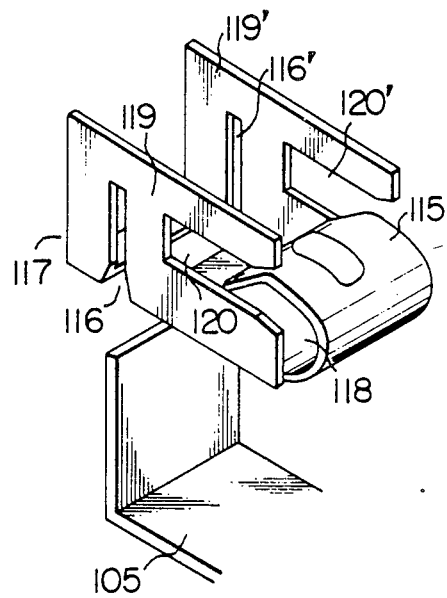
FIG. 5 is a perspective view of a terminal member as shown in FIG. 4A.
Figure 6:
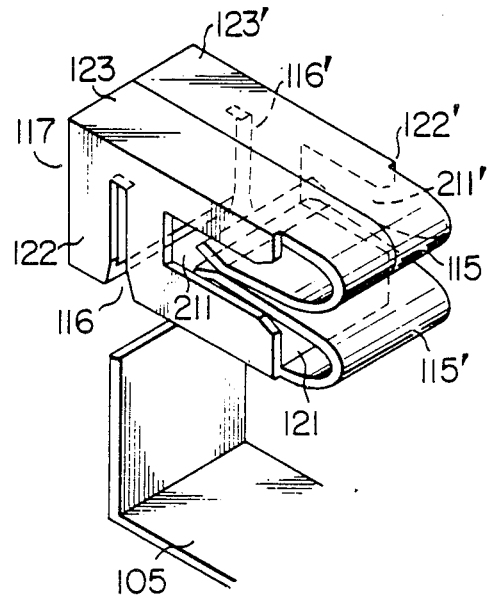
FIG. 6 is a perspective view of a modification of the terminal member.
Figure 7:
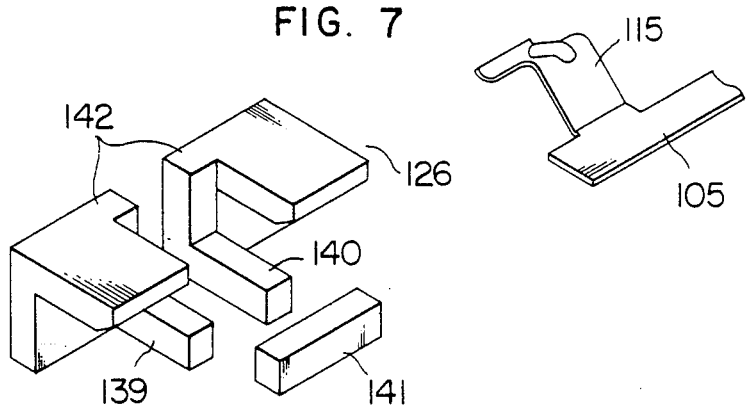
FIG. 7 is an exploded perspective view of an example which does not incorporate the terminal member shown in FIG. 4A but incorporating a resilient contact tab provided at the end of the bus bar.
Figure 8:
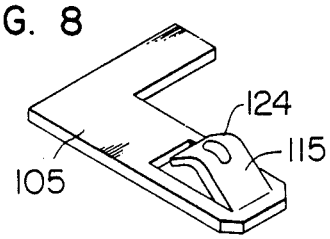
FIG. 8 is a perspective view of still another example incorporating, as in the case of the example shown in FIG. 7, a resilient contact tab on the end of the bus bar.

As shown in FIGS. 4A, 5 and 6, the resilient contactors 115 may be formed on a terminal member 117 having slots 116,116′ for engaging the protruding end of the bus bar conductor 105. Alternatively, the resilient contactor 115 may be formed by protruding a part of the end of the bus bar conductor 105 projections in the form of a mountain or inverted V from the major plane of the bus bar conductor 105, as shown in FIGS. 7 and 8.

Since the connection is attained through the resilient contact of the contactors 115 with the surfaces of the conductors 113,113′ on the printed circuit board (C), it is possible to obtain and maintain a stable electric connection without causing any damage of the conductors 113,113′.

The terminal member 117 shown in FIGS. 4A and 5 has a lower wall 118, side walls 119,119′ protruding from both sides of the lower wall 118 and slots 120,120′ extending rearwardly from the front ends of the side walls 119,119′. The aforementioned resilient contactor 115 projects on from the front end of the lower wall 118 and is bent upwardly and rearwardly to overlie the lower wall 118 in a mountain-like form. The aforementioned slots 116 continue from the lower wall 118 into respective side walls 119,119′. The arrangement is such that, while the end of the bus bar conductor 105 is inserted into the slots 116,116′, the printed circuit board 110 is inserted into the slots 120,120′ so that the printed circuit board 110 is clamped between one side of the slots 120,120′ and the resilient contactor 115 in such a manner that the surface of the mountain-shaped portion of the resilient contactor 115 makes a pressure contact with the surface of the terminal 114.

FIG. 6 shows another example of a terminal member which has a lower wall 121, side walls 122,122′ standing upright from both sides of the lower wall 121 and upper walls 123,123′ extending towards each other from the upper ends of respective side walls 122,122′. Slots 211,211′ extend rearwardly from the front ends of both side walls 122,122′. The aforementioned resilient contactors 115,115′ project forwardly from the upper walls 123,123′ and the lower wall 121, respectively, and are bent rearwardly so as to oppose to each other, and the aforementioned slots 116,116′ continue from one side wall 122 to the other 122′ through the lower wall 121. The slot 116 is adapted to receive the end of the bus bar conductor 105 while the printed circuit board is forcibly driven into the gap between the resilient contactors 115,115′ so that the mountain-shaped surface of the resilient contactor 115 makes a pressure contact with the surface of the terminal 114.

In the terminal members 117 shown in FIGS. 5 and 6, the slots 116,116′ for receiving the bus bar conductor 105 are formed by cutting both side walls in a continuous form through the lower wall. Namely, these slots 116 and 116′ are formed in the lower portions of both side walls in the area where they are connected to the lower wall. Deviation of position is less liable to occur in this area even due to bending of the blank in the process of production of the terminal member. It is, therefore, possible to form both slots 116,116′ precisely in lateral alignment with each other.

In the terminal member 117 shown in FIG. 5 having a single resilient contactor 115, the resilient contactor 115 can be bent at a large curvature to provide a wide range of resiliency of the contactor. This also contributes to the reduction in size of the terminal member 117.

In the terminal member 117 shown in FIG. 6, the printed circuit board 110 is clamped by a pair of resilient contactors 115,115′. Therefore, any change in the contact pressure between the printed circuit board 110 and the terminal member 117, which may be caused by a slight deformation by external force applied during storage and assembling, can be absorbed because the contact pressure is shared by the resiliencies of both resilient contactors 115,115′. As a result the printed circuit board 110 can be held stably.

In the example shown in FIG. 7, the resilient contactor 115 is formed by extending the end of the bus bar conductor 105 in the direction of the plane in which the bus bar conductor 105 extends and bending the same in a mountain-like form. In the example shown in FIG. 8, the resilient contactor 115 is formed by cutting and raising a part of the end of the bus bar conductor 105 to form a tongue and then deflecting and deforming the tongue in the mountain-like form.

The resilient contactors 115 as shown in FIG. 7 or 8 permit a direct electric connection between the bus bar conductor 105 and the conductors 113,113′ on the printed circuit board 110 and, hence, decreases the voltage drop as compared with the electric connection which employs the separate terminal members 117 as shown in FIG. 5 or 6.

Figure 9:
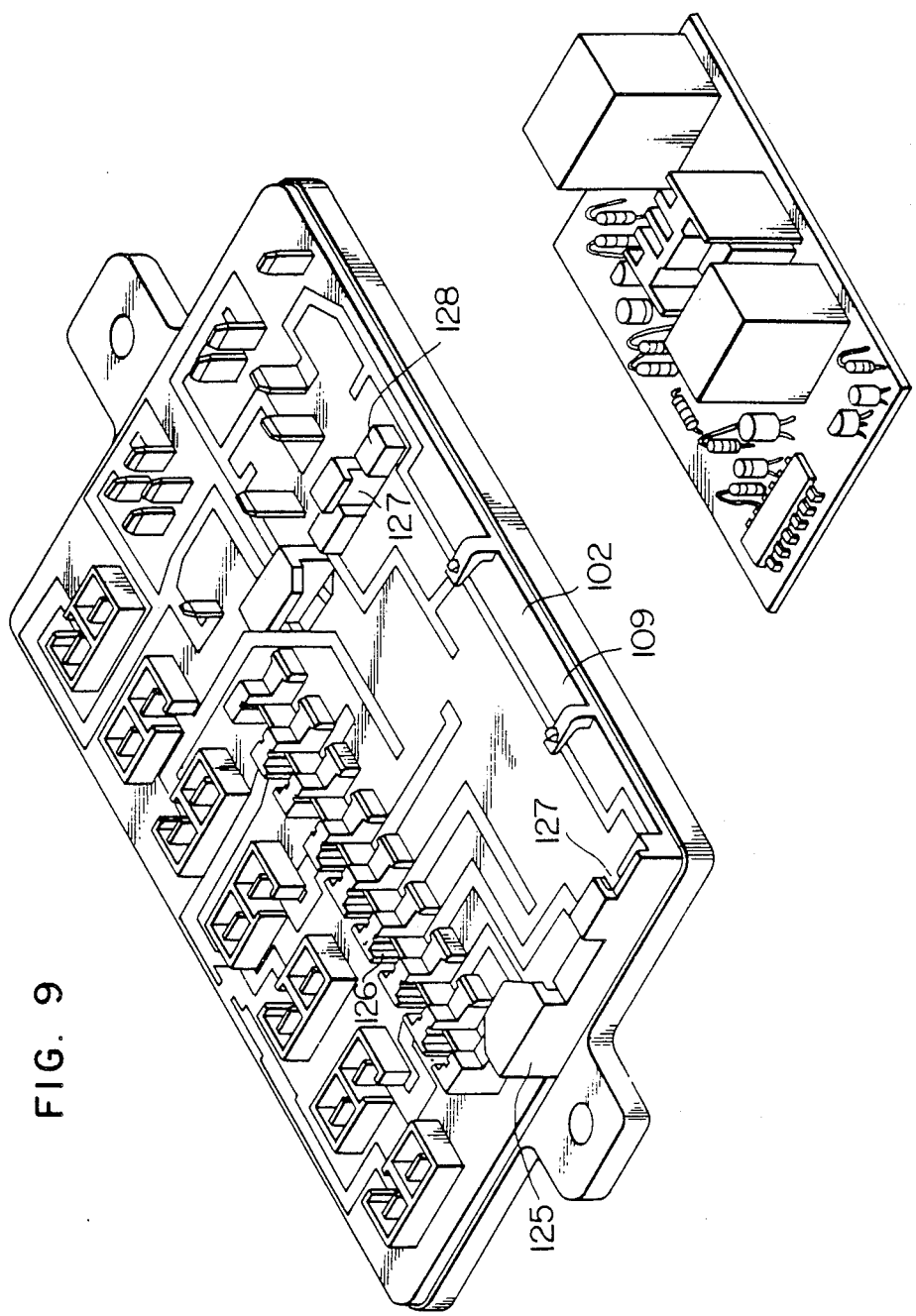
FIG. 9 is a partially exploded perspective view of a modification of a receiving seat of the type shown in FIG. 4A.

FIG. 9 shows an example of a receiving seat 125 formed on the bus bar wiring board 102 and used with terminals 108 of the bus bar conductor 105 by employing the terminal members 117 of the embodiment as shown in FIG. 5 or 6. The receiving seat 125 has intermediate seat portion 126, for receiving the ends of the bus bar conductors 105, i.e. the terminals 108,108′, and guide grooves 127,127′ for guiding and receiving the printed circuit board 110. The arrangement is such that, as the printed circuit board 110 is inserted into the guide grooves 127,127′, the terminals 114 on the printed circuit board 110 are resiliently contacted by the resilient contactor 115 formed in the terminals 108,108′ which are fixed to the intermediate seat portions 126.

The receiving seat 125 may be formed as a unit with the insulation plate 109 on the bus bar wiring board 102 as shown in FIG. 9 or, alternatively, separately from the same as shown in FIG. 4A.

In the case where the receiving seat 125 is formed integrally with the bus bar wiring board 102, the surface of the receiving seat 125 becomes flush with the surface of the insulation plate 109. In this case, in order to make use of this surface as the wiring portion of the bus bar conductor 105, a notch is formed in the wall 128 having the guide groove 127 in such as manner as not to impede the guiding function of the guide groove 127 and so as to form a passage for the bus bar conductor 105.

When the receiving seat 125 is formed as a member separate from the insulation plate 109, the supporting seat 125 has a substantially U-shaped cross-section constituted by the walls 129,129′ having the guide grooves 127,127′ and the wall 130 which form the intermediate seat portions 126,126′ such as the embodiment shown in FIG. 4A. In this case, the receiving seat 125 and the insulation plate 109 are fixed to each other by mating convexity and concavity.

The integral construction of the receiving seat 125 and the insulation plate 109 is more advantageous than the separate construction in that the number of steps of process for assembling the electrical junction system 101 is decreased. On the other hand, the separate construction advantageously permits an easy arraying of the bus bar conductors 105 because of absence of any obstacle between the inner surface of the substantially U-shaped receiving seat 125 and the surface of the insulation plate 109. That is, it is possible to mount the receiving seat 125 of the printed circuit board 110 after arraying the bus bar conductors 105.

The construction of the intermediate seat portions 126,126′ will be more fully described with reference to FIGS. 10 and 11.

Figure 10:
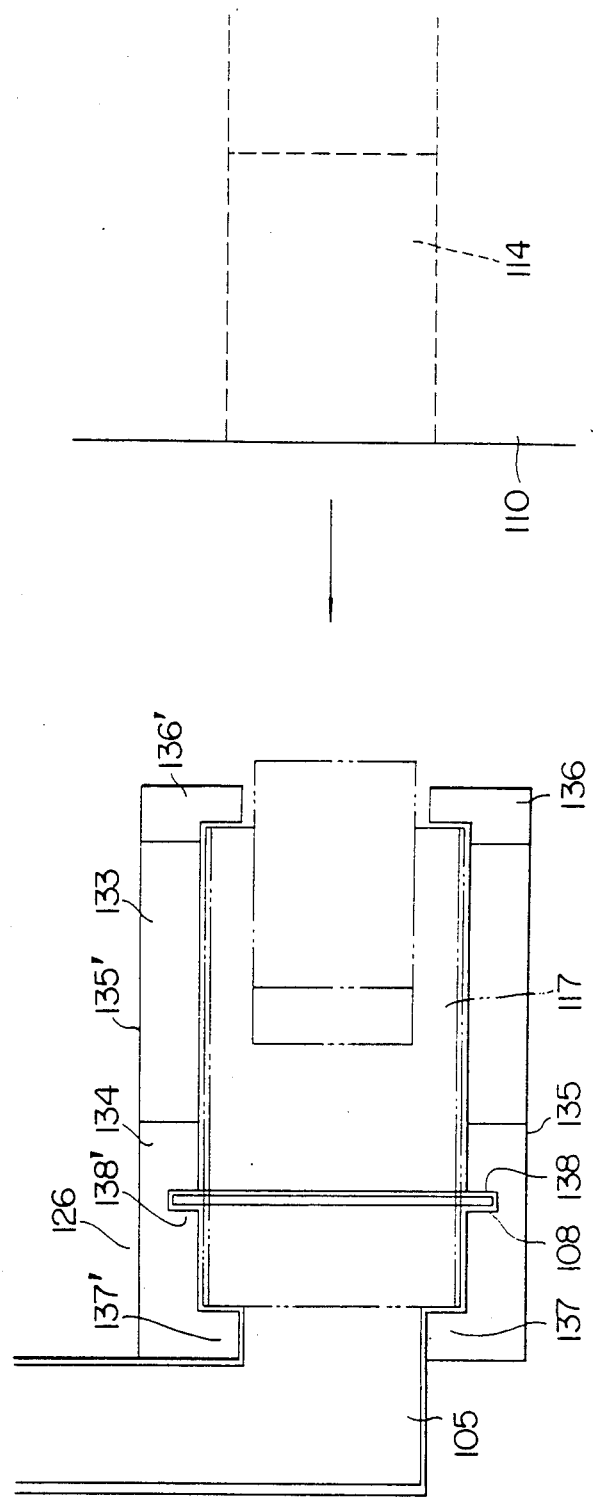
FIG. 10 is a plan view of a relay seat portion of the receiving seat shown in FIG. 4A.
Figure 11:
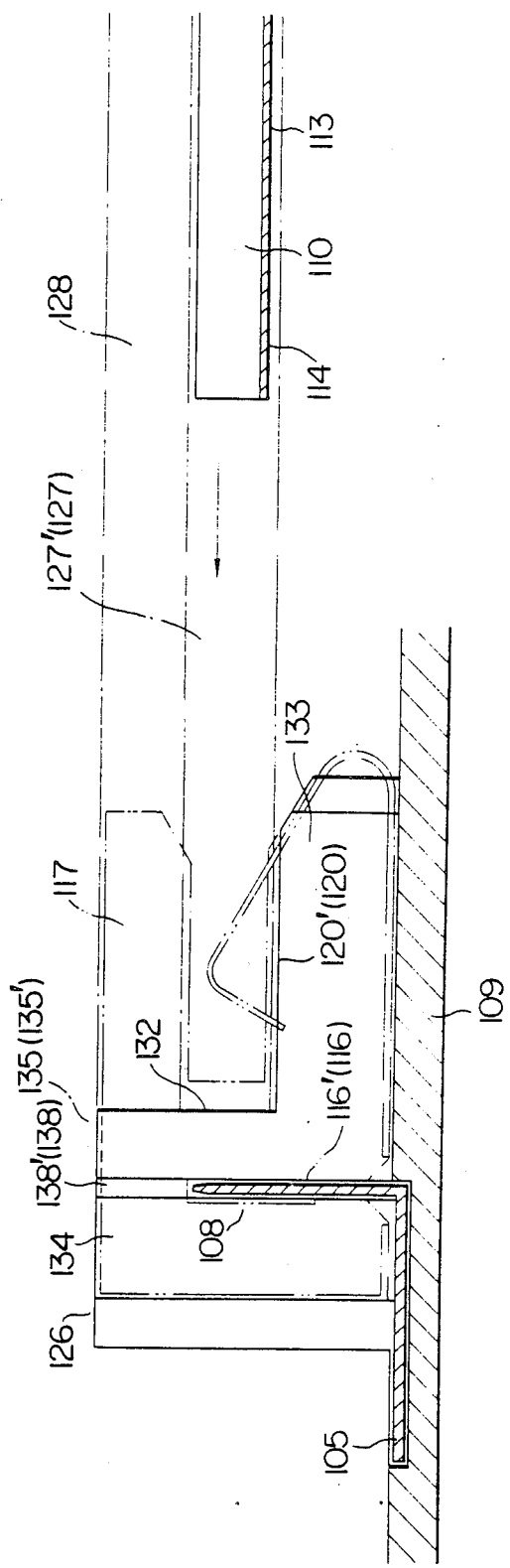
FIG. 11 is a cross-sectional view of the relay seat portion shown in FIG. 10 taken at the mid portion thereof.

Namely, FIGS. 10 and 11 show the construction of the intermediate seat portions 126,126′ which are used for the terminal 108 of the bus bar conductor 105 formed by using the terminal member 117 shown in FIG. 5 and which are formed in the receiving seat 125 integrated with the insulation plate 109 as shown in FIG. 9.

As will be seen from FIGS. 10 and 11, the intermediate seat portions 126, have opposing side walls 135,135′ protruding from the insulation plate 109 and lowered through a step 132 in the direction for receiving the printed circuit board 110. The lower portion serves as a base 133 while the raised portion serving as a support 134. Retaining tabs 136,136′ are formed between the bases 133 and slightly project toward each other. Retaining tabs 137,137′ are formed between the supports 134 and project slightly toward each other; and a pair of grooves 138,138′ on the opposing surfaces of the supports 134 and extend in the direction of rise of the side walls 135,135′.

To cooperate with the intermediate seat portions 126,126′, the bus bar conductors 105 have portions protruding at a position between the retainer tabs 136,136′ or between the retainer tabs 137,137′ into the space between the side walls 135,135′. Both side edges of the protruding portions are received in the grooves 138,138′ in the support 134. The terminal member 117 engages at its slots 116,116′ with the bus bar conductor 105 that is received by the intermediate seats 126,126′ is surrounded by the side walls 135,135', retainer tabs 136,136' and the retainer tabs 137,137' so that it is prevented from moving in the direction of the plane.

In this state, the lower ends of the slots 120,120' in the terminal member 117 are held substantially at the same level as the upper surface of the base 133. The guide grooves 127,127' in the wall 128 and guiding the printed circuit board 110 take the same level as the slots 120,120'.

Therefore, the printed circuit board 110, which has been guided by the guide grooves 127,127', is further guided by the slots 120,120'.

Although the construction of the intermediate seat portions 126,126' has been described in connection with the terminal member 117 shown in FIG. 5, it will be clear to those skilled in the art that the same construction of the intermediate seat portions 126,126' can be adopted to provide the same effect in combination with the terminal member 117 as shown in FIG. 6.

The construction of the receiving seat is basically unchanged even in the case where the receiving seat 125 and the insulation plate 109 are constructed as separate bodies. The sole change resides in that the retainer tabs 137 and 137' (see FIG. 10) are connected integrally to each other so that the bus bar conductor 105 (see FIG. 11) moves into the intermediate seat portions 126, via the lower side of the retainer tabs 137,137', which are integral with each other.

On the other hand, the intermediate seat portions 126, for receiving the terminal 108 formed by the end of the bus bar conductor 105 may be constituted by, as exemplarily shown in FIG. 7, the retaining tabs 139,140 and 141. The tabs 139, 140 and 141 prevent movement in the direction of the plane of the bus bar conductor 105. An auxiliary tab 142 assists the terminals 114,114' of the printed circuit board in making a pressure contact with the mountain-shaped resilient tab 115.

To sum up, all that is required for the intermediate seat portions 126,126' are the means for preventing the movement in the direction of the bus bar conductor 105, and means for assisting the terminals 114,114' of the printed circuit board 110 in making pressure contact with the mountain-shaped resilient contactor 115.

Figure 12:
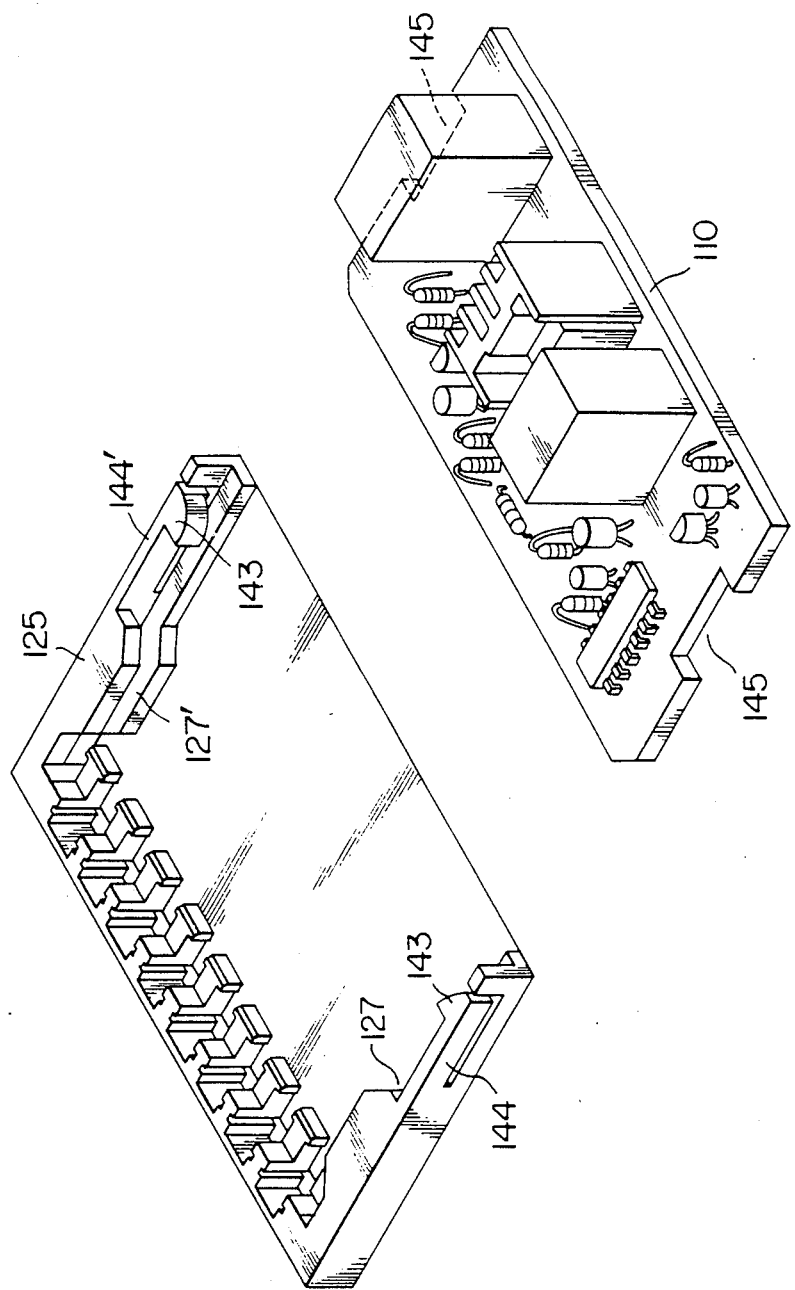
FIG. 12 is a partially exploded perspective view of an example in which the printed circuit board is retained by the receiving seat.

FIG. 12 shows means for retaining the printed circuit board 110 in the guide grooves 127,127' in the receiving seat 125 after the insertion of the printed circuit board into these guide grooves. Cantilevered arms 144,144' formed in the guide grooves 127,127' have retaining projections 143 projecting into these guide grooves 127,127'. Recesses 145 adapted to be engaged by the projections 143 are formed in the printed circuit board 110.

As has been described, according to the first embodiment of the invention, there is provided an electrical junction system of the type having an insulation box 103 accommodating a bus bar wiring board 102 and provided with connection parts through which the bus bar conductors 105 on the bus bar wiring board 102 inside the insulation box 103 and the electric wires 106 in the wiring harness outside the insulation box are connected to each other. As a result of this construction numerous branching circuits existing in the automotive internal electric wiring are connected in a concentrating manner in the insulation box. The improvement comprises a printed circuit board 110 which generally or inclusively mounts various functional parts which are used semi-permanently, e.g. relays. The printed circuit board is provided with conductors 113,113' formed by, for example, copper foils and accommodated together with the bus bar wiring board 102 in the insulation box 103. The bus bar conductors 105 on the bus bar wiring board 110 and the conductors 113,113' of the printed circuit board 110 are made to contact each other through resilient contactors 115 provided on the ends of the bus bar conductors and adapted to make resilient contact with the surfaces of the conductors 113,113' formed by the copper foils or the like.

It is, therefore, possible to arrange various branching circuits in the wiring harness, as well as functional parts semi-permanently used and included by the wire harness, e.g. relays, diodes, capacitors and so forth, in the insulation box 103 at a high density and without any substantial difficulty. As a consequence, the number of intermediate joints in the wiring harness is decreased to facilitate the production of the wiring harness and to reduce the size and weight of the same.

Figure 13:
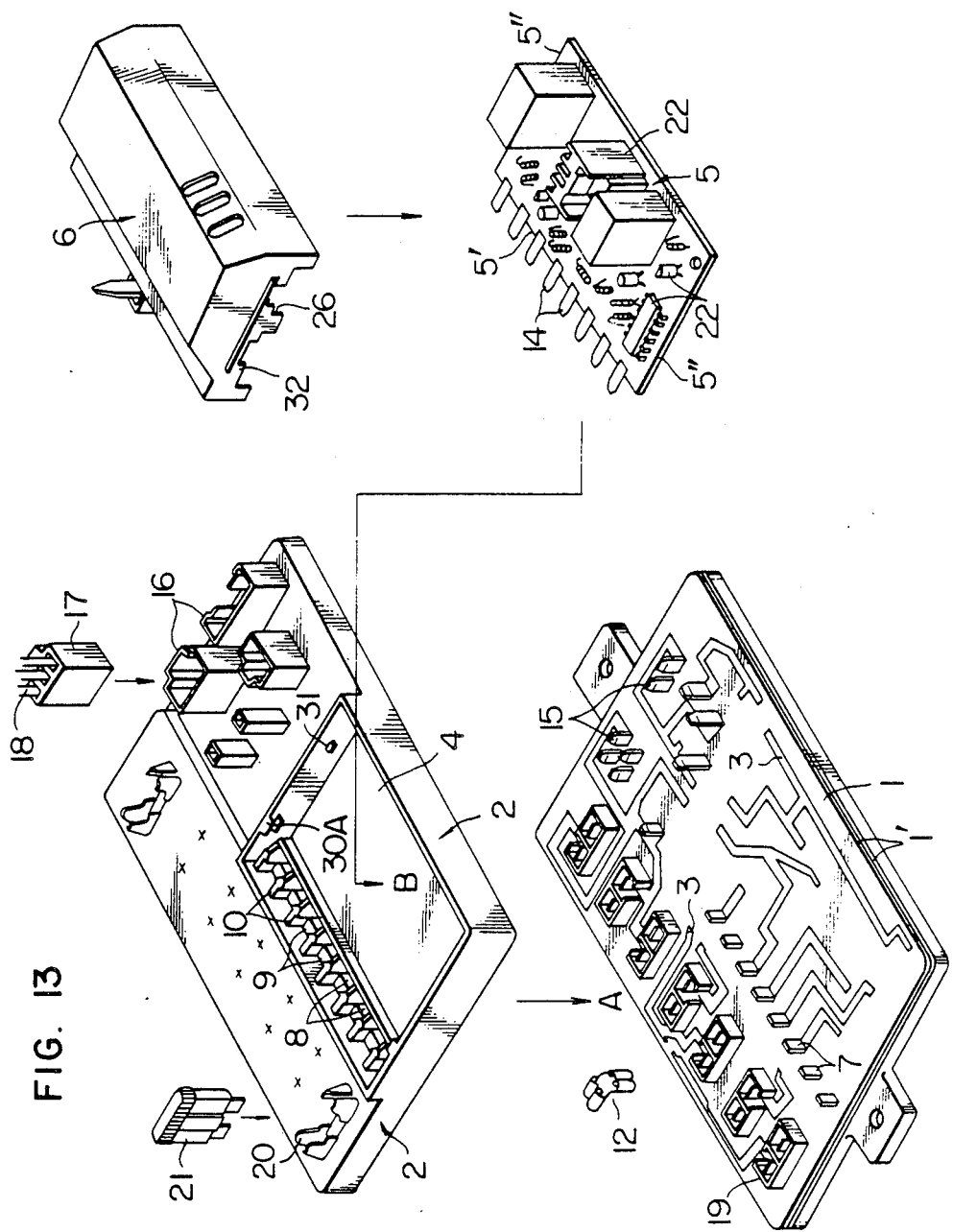
FIG. 13 is an exploded perspective view of the whole portion of a second embodiment of the invention.

FIG. 13 shows a second embodiment of the invention having a wiring board 1 having a laminated structure constituted by a plurality of insulation plates 1' in the form of thin sheets. Each insulation plate 1, carries known bus bars 3 which constitute a group of branching conductors corresponding to the branching circuits assembled in the wiring harness. This embodiment further has a case member 2 adapted to cover the wiring board 1 from the upper side thereof, a printed circuit board 5 mounting various functional parts 22 in a concentrating manner and a cover member 6 for the printed circuit board and its functional parts. The wiring board 1 is provided with a rectangular recess 4 adapted to receive the printed circuit board 5 to which the cover member 6 is secured. In assembling, the case member 2 is attached to cover the wiring board 1 as indicated by arrow A, while the cover member 6 is secured to the printed circuit board 5 as shown by arrow B. Then, the printed circuit board 5 with the cover member 6 is mounted in the recess 4, as shown by the arrow C, to achieve electric connection between the conductors of the printed circuit board 5 and the ends of the bus bars 3.

Figure 15:
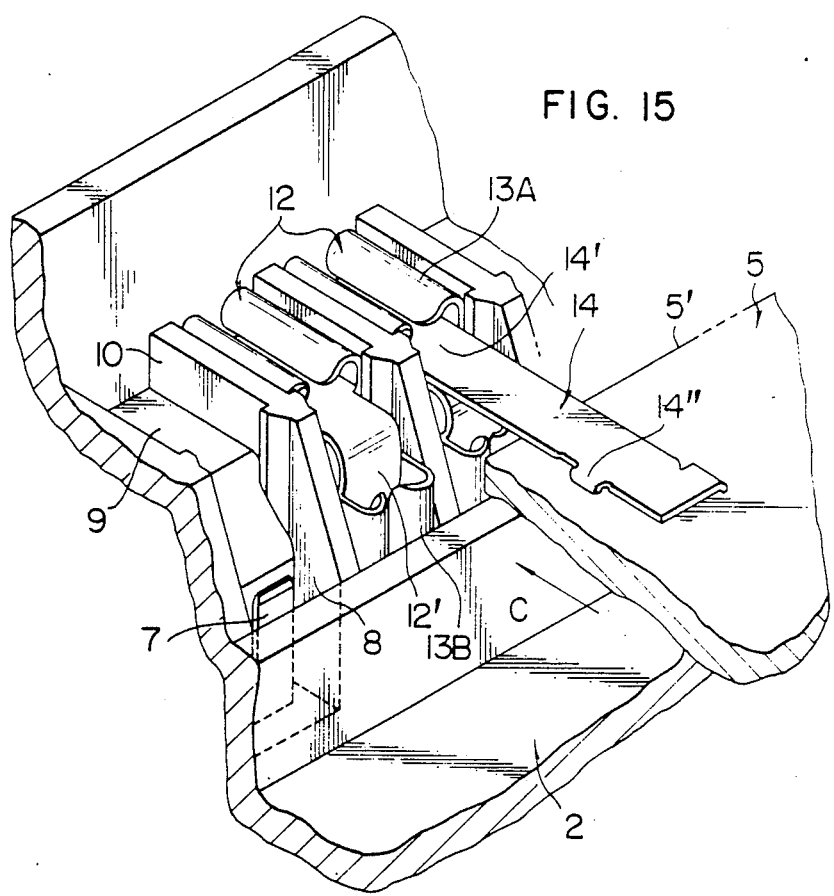
FIG. 15 is an enlarged perspective view showing the connection between the printed circuit board incorporated in the embodiment shown in FIG. 13 and the connecting portion of a bus bar.

More specifically, the ends of the bus bars 3 to which the functional parts are to be connected are arranged in a concentrated manner in the form of upright tab-like contactors 7 arrayed along a line. Slit-like through holes 8 are formed in the bottom of the recess 4 in the case member 2 at positions corresponding to the positions of the tab-like contactors 7. Intermediate terminal receiving seats 9, which are defined by walls 10, are formed above the through holes 8. Each receiving seat 9 is adapted to receive an intermediate terminal 12 which is an L-shaped female terminal formed, as shown in FIG. 15, by bending the central portion of a substrate 12' at 90° with a small curvature and forming receptacle-like contactors 13A and 13B at both outer sides of the bent substrate 12'. The lower contactor 13B is adapted to fit the tab-like contactor 7 projected through the through hole 8 while the upper contactor 13A is adapted to rest in the receiving seat 9 defined by the walls 10. The printed circuit board 5, which will be detailed later, is inserted in the direction of arrow C so that a connection is achieved between the tab-like contactor 14' of the terminal 14 on the front edge 5' of the printed circuit board 5 and the contactor 13A of the intermediate terminal 12.

In FIG. 13, a reference numeral 15 denotes a tab-like contactor on the end of the bus bar 3 adapted to be connected to wires 18 of the wiring harness. The arrangement is such that, as the case member 2 is mounted, the tab-like contactors 15 are positioned beneath connection ports 16 which are formed in a concentrated manner at a corner of the case member 2 so that they are electrically connected to the wires 18 by connectors 17 that are connected to the ends of the wires and which are received by the connecting parts 16. In FIG. 13, a reference numeral 19 designates a fuse support of the branching conductors which are arrayed in the vicinity of side edge of the wiring plate 1. The fuse support 19 is mounted in a fuse receiving recess 20 formed in the case member 2. A bifurcated fuse 21 is inserted into each fuse support 19 from the upper side of the latter.

Figure 14:
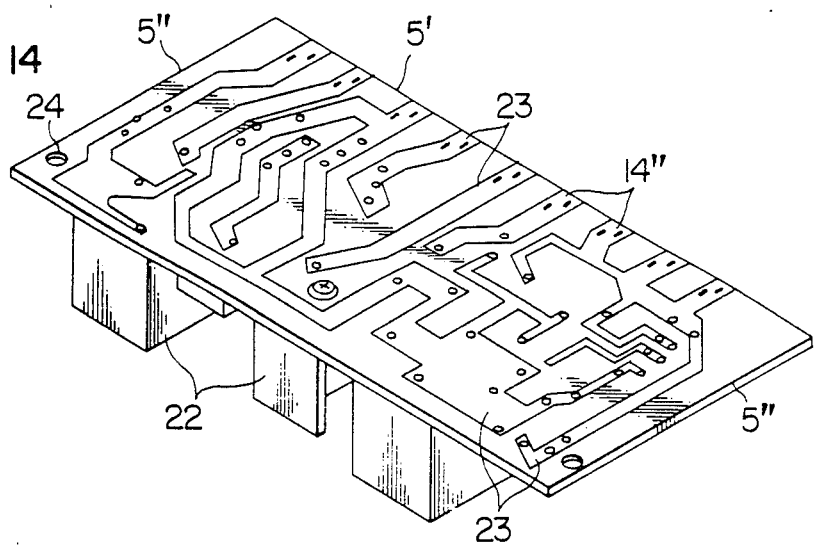
FIG. 14 is a perspective view of the printed circuit board incorporated in the embodiment shown in FIG. 13 as viewed from the rear side thereof.

On the other hand, the printed circuit board 5 carries all of the functional parts 22 required for by the branching circuits of the wiring harness, e.g. relays, diodes, capacitors and so forth. As will be seen from FIG. 14, conductors 23 for respective functional parts 22 are printed on the lower side of the printed circuit board 5. The ends of the conductors 23 are arranged along one side edge 5' of the printed circuit board at a suitable spacing. The arrangement is such that the positions of the ends of the conductors 23 precisely correspond to the positions of the tab-like contactors 7 of the wiring board 1 when the printed circuit board 5 is attached to the latter. As will be seen from FIG. 15, terminals 14 having tab-like contactors 14' for connection to the intermediate terminals 12 are formed on the portions of the upper side of the printed circuit board corresponding to the conductors 23. The terminals 14 have tabular bodies with legs 14" at base portions thereof and are electrically connected to the conductors 23 on the lower side of the board 5 by being soldered at these legs 14".

The cover member 6 is a hollow protective member for accommodating the functional parts 22, and is adapted to be detachably secured to the wiring board 1 as it is secured to the printed circuit board 5 in such a manner as to cover the functional parts 22. More specifically, referring to FIGS. 13 and 16 to 18, attaching holes 24 are formed in the rear portions of both side edges 5" of the printed circuit board 5, while engaging grooves 26 are formed at the inner central portion of the lower edges of both side walls of the cover member 6. In assembling, the cover member 6 is pressed with small force from the upper side thereof so that the engaging grooves 26 are brought into engagement with the side edges 5". Then, locking pins 27 formed on a boss portion 28 of the cover member 6 are inserted into the attaching holes 24 so as to fix the cover member 6 to the printed circuit board 5.

A resilient tab 29 for making pressure contact with the lower side of the printed circuit board 5 is provided on the top of the locking pin 27 to absorb and eliminate the vertical play of the printed circuit board 5 due to vibration during the use.

Holder tabs 30A and 30B spaced vertically from each other and constituting a pair are formed on the front portion of the inner side of each side wall of the recess 4 in the wiring board 1. A holding tab 31 is formed on the rear portion of the same side wall. Engaging protrusions 32 adapted to be received in the gap between the holding tabs 30A, 30B are formed on the outer surfaces of the side walls of the cover member 6. Also, openings 25 for receiving the holding tabs 31 are formed at the rear side of the engaging protrusions 32. Slits 25' for clamping the holding tabs 31 are formed at the upper portions of the openings 25 so as to extend rearwardly therefrom along the engaging protrusions 32.

Figure 16:
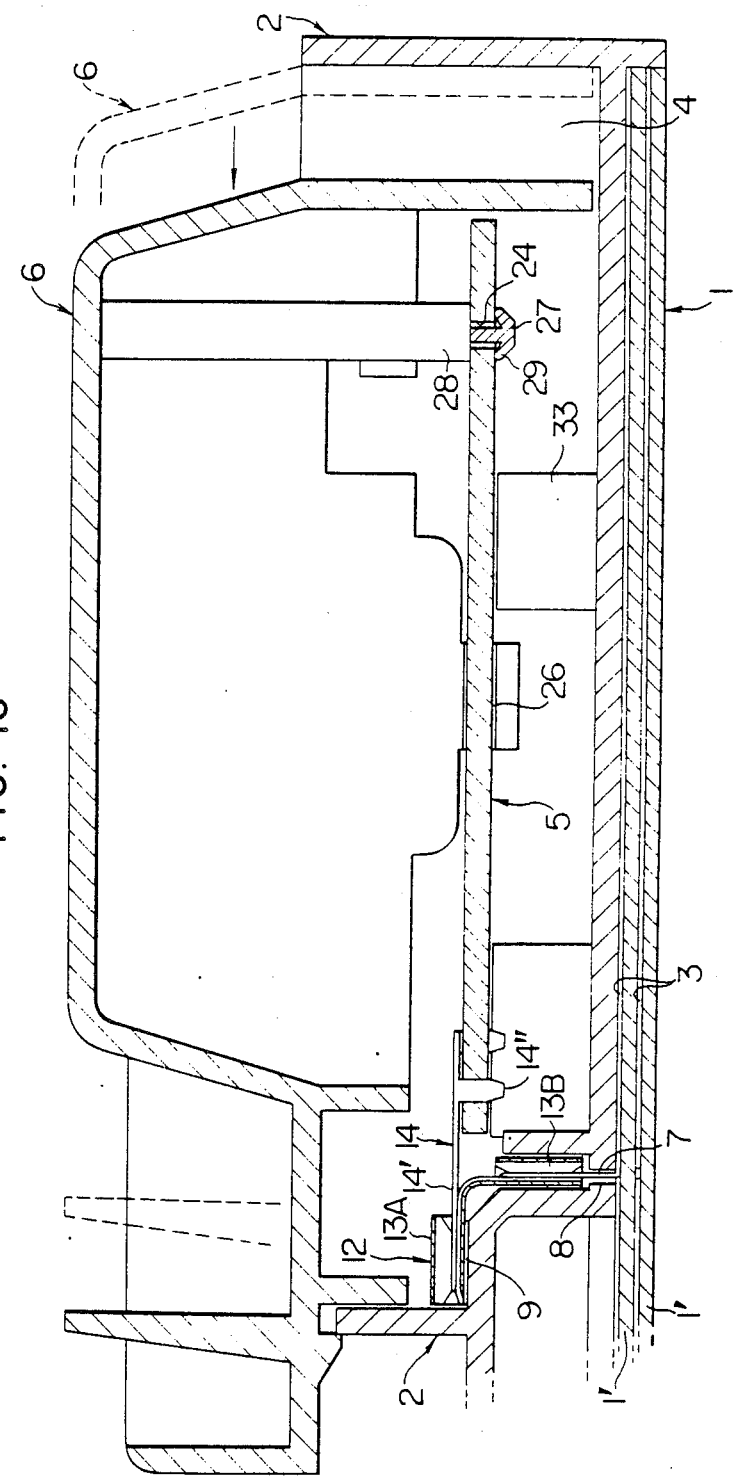
FIGS. 16 and 17 are vertical sectional views showing the state of attaching of printed circuit board in the embodiment shown in FIG. 13.
Figure 17:
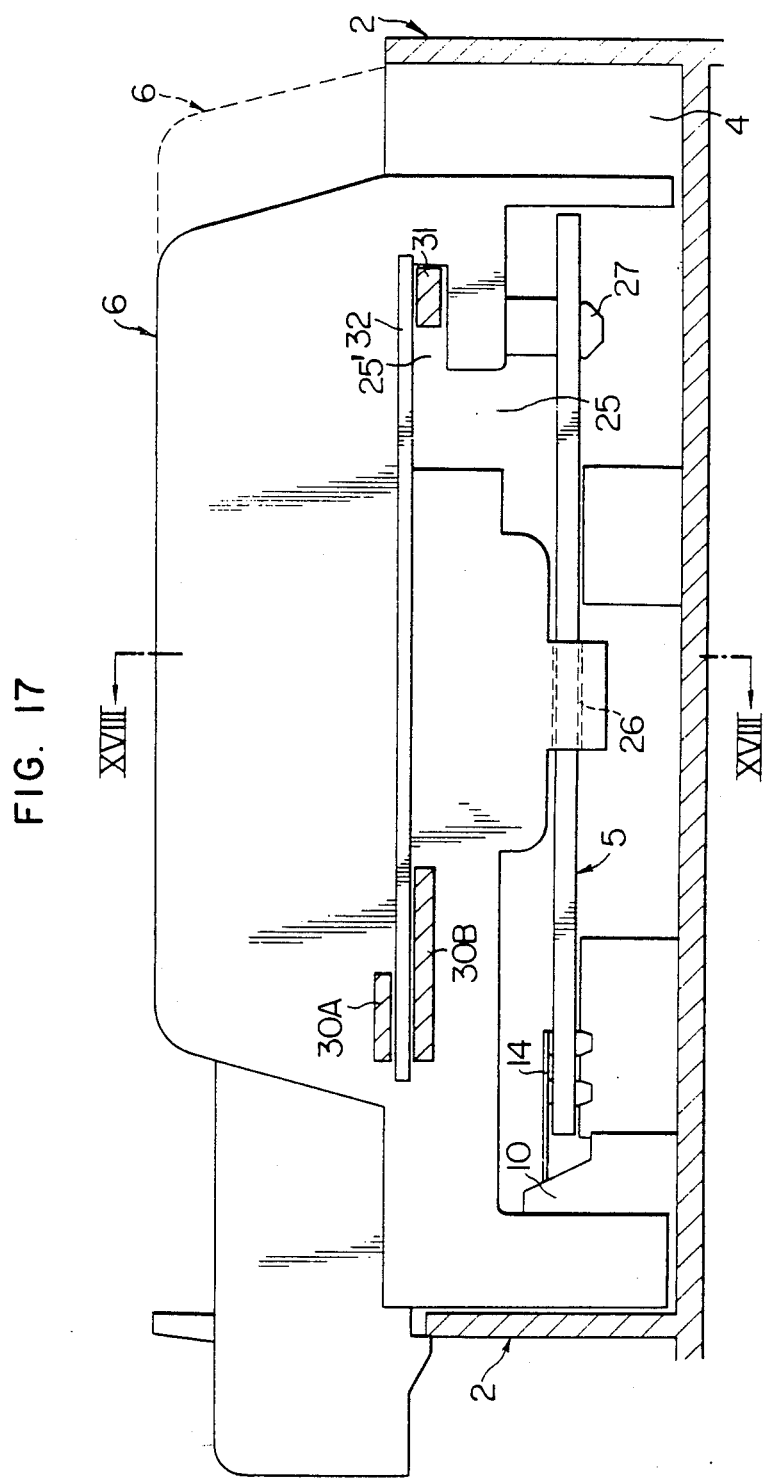
Figure 18:
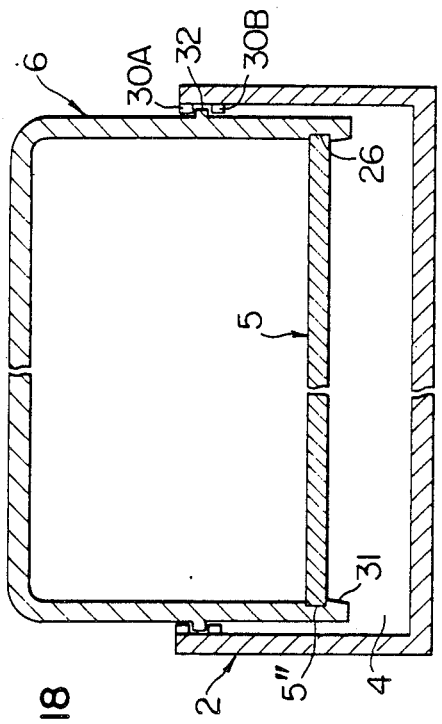
FIG. 18 is a sectional view taken along the line XVIII—XVIII of FIG. 17.

In assembling, the printed circuit board 5 with the cover member 6 is fitted in the rearmost position in the recess 4 as shown by broken lines in FIGS. 16 and 17 such that the holding tabs 31 are received by the openings 25 and is then slid forwardly as indicated by an arrow so that the engaging protrusions 32 are brought into the gaps between the holding tabs 30A and the holding tabs 30B on both sides, while the holding tabs 31 are received by respective slits 25'. In this state, the cover member 6 has a stable engagement with the recess 4 without substantial play in lateral directions. A reference numeral 33 appearing in FIG. 16 designates a guide portion provided on the inner side of the recess 4 to auxiliarily support and guide the lower edge of the printed circuit board 5 received by the recess 4.

By mounting the printed circuit board 5 on the wiring board 1 together with the cover member 6 in the manner described, the circuits formed on the printed circuit board 5 are connected to corresonding branching circuits constituted by the bus bars 3.

It will be seen that the printed circuit board 5 can easily be detached from the wiring board 1 for inspection or maintenance work, by taking the reverse procedure.

In the second embodiment of the electrical connection system of the second embodiment, the functional parts necessitated by the branching circuits of the wiring harness are arranged densely on the printed circuit board 5 so as to save installation space, so that the size of the electrical connection system as a whole is much decreased as compared with the conventional relay-unit type system which employs casings of large volumes. This meets the requirement of increase in the number of the function parts, upgrading and complicating of the branching circuits and so forth to cope with the demand for upgrading of automobiles, while satisfying the requirements imposed by the restricted installation space.

Furthermore, the second embodiment of the electrical junction system offers various other advantages. For instance, the construction of the wiring harness as a whole is simplified to facilitate the division and automation of the production process to improve the productivity. In addition, the functional parts are safely protected by the cover member 6. It is also to be noted that the printed circuit board 5 carrying the cover member 6 can easily be attached to and detached from the wiring board without encountering substantial resistance in connecting and disconnecting the mating terminals.

In the second embodiment heretofore described, the conductors 23 of the printed circuit board 5 may be connected to other portions of the bus bars 3 and there intermediate portions. Namely, in some cases, one end of the functional part circuit of the printed circuit board 5 may be connected to the bus bars 3 and the other end to the terminal of the connector.

In the described second embodiment, the printed circuit board 5 is attached to and detached from the wiring board 1 as it is slided forwardly and rearwardly along the wiring board 1. This arrangement, however, is not essential and may be substituted by the following construction.

Figure 19:
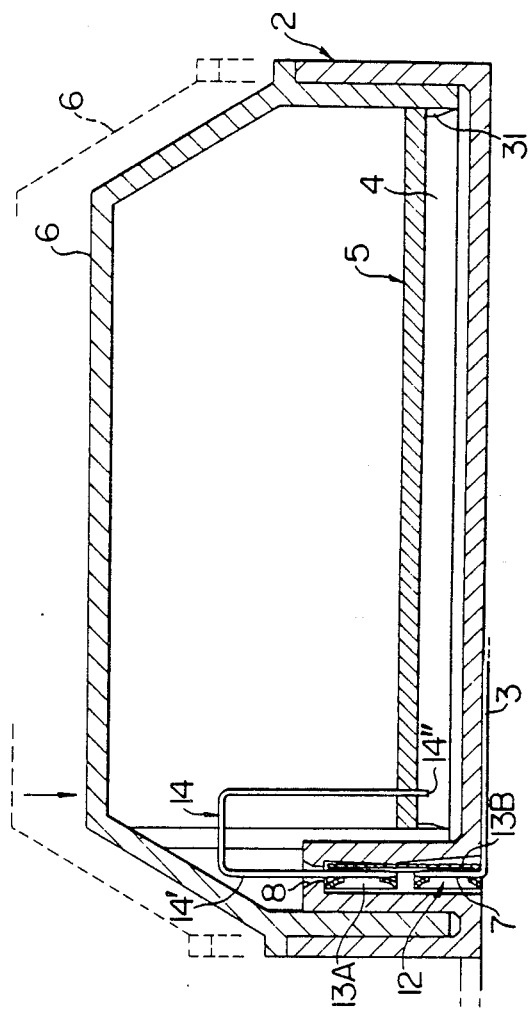
FIG. 19 is a vertical sectional view of an essential part of a third embodiment of the invention.

Namely, FIG. 19 shows a third embodiment in which the connection is achieved between U-shaped terminals 14 attached to the printed circuit board 5 and intermediate terminals 12 vertically attached to the tab-like contactors 7. In this case, the printed circuit board 5 carrying the cover member 6 is vertically moved into and out of engagement with the wiring board 1. The holding tabs 30A, receiving seats 9 and walls 10 may be formed directly on the wiring board 1. The fixing of the printed circuit board 5 to the cover member 2 may be achieved by other means than described. Namely, it is possible to fix the printed circuit board 5 to the case member 2 by making the inner wall of the recess 4 of the case member 2 directly engage both side walls 5" of the printed circuit board 5.

Other portions of the third embodiment than specifically mentioned above are materially identical so those of the second embodiment described hereinbefore.

Figure 20:
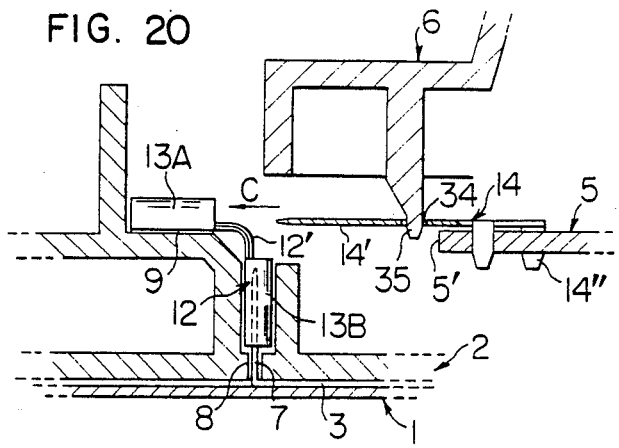
FIG. 20 is a partially exploded cross-sectional view showing a fourth embodiment of the invention.

FIG. 20 shows an essential part of a fourth embodiment of the electrical junction system in accordance with the invention. The fourth embodiment is characterized by having, in addition to the construction of the second embodiment, a load carrying mechanism which bears the load produced when the terminals 14 and the intermediate terminals 12 are connected and disconnected to and from each other during mounting and demounting of the printed circuit board 5 to and from the wiring board 1. This load bearing mechanism protects the terminals 14 and the printed circuit board 5 which are soft and fragile.

More specifically, referring to FIG. 20, a load bearing hole 34 is formed in the longitudinal intermediate portion of the terminal 14 while a bearing rod 35 is suspended from the top wall of the cover member 6. The arrangement is such that, in attaching the cover member 6, the bearing rod 35 is inserted into the bearing hole 34. In addition, the connection of the cover to the printed circuit board 5 limits the relative movement in the left and right directions as viewed in FIG. 20. According to this arrangement, the force generated by the resistance during connecting and disconnecting the terminals 14 and the intermediate terminals 12 is born by the bearing rod 35, so that no force is applied to the soldered portions and the printed circuit board 5 which are generally weak and fragile. Namely, when the cover body 6 and the printed circuit board 5 as a unit are moved in the direction of the arrow C to bring the terminals 14 into engagement with the receptacle-like contactors 13A, the force applied to the portion of each terminal 14 at the left side of the bearing rod 35 is received and borne by the latter, so that no substantial force is applied to the printed circuit board 5 nor to the connection between the printed circuit board 5 and the terminals 14.

The functional part circuits on the printed circuit board 5 are connected to corresponding branching conductors constituted by the bus bars 3, as the printed circuit board 5 is mounted on the wiring board 1 while the load bearing mechanism bears the resistance encountered during the mounting.

Other portions of the fourth embodiment are materially identical to those of the second embodiment.

Figure 21:
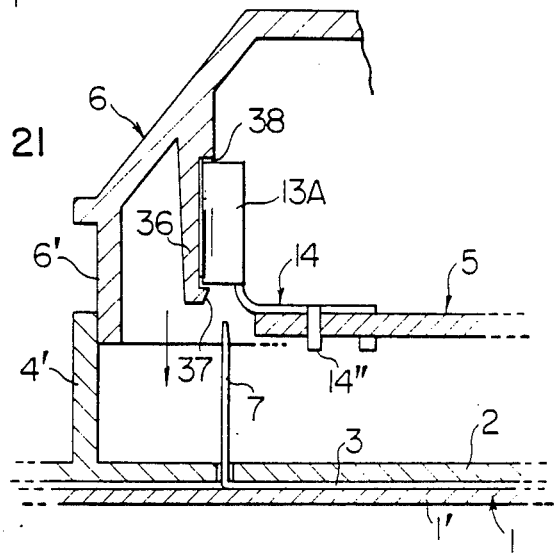
FIG. 21 is a partially exploded cross-sectional view showing a fifth embodiment of the invention.

FIG. 21 shows a fifth embodiment of the invention in which, as in the case of the third embodiment (FIG. 19), the printed circuit board 5 is attached to and detached from the wiring board 1 by moving the cover member 6 up and down. In this fifth embodiment, the printed circuit board 5 is provided with L-shaped terminals 14 having receptacle-like contactors 13A for receiving the tab-like contactors 17. A resilient retaining tab 36 suspended from the inner surface of the top wall of the cover member 6 has claws 37 and 38 for retaining the upper and lower ends of the receptacle-like contactor 13A. The arrangement is such that, as the cover 6 is fitted to the printed circuit board 5 from the upper side of the latter, the claws 37 and 38 of the retainer tab 36 are brought into engagement with the terminal 14 whereby the retaining tab 36 bears the load produced by the friction of the terminal 14.

Figure 22:
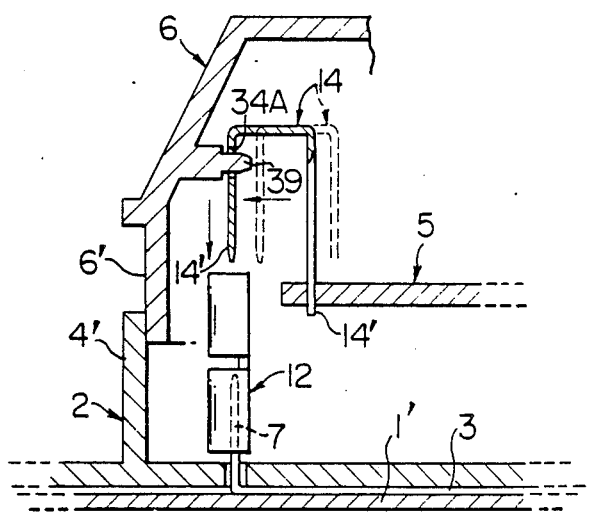
FIG. 22 is a partially exploded cross-sectional view showing a sixth embodiment of the invention.
Figure 23:
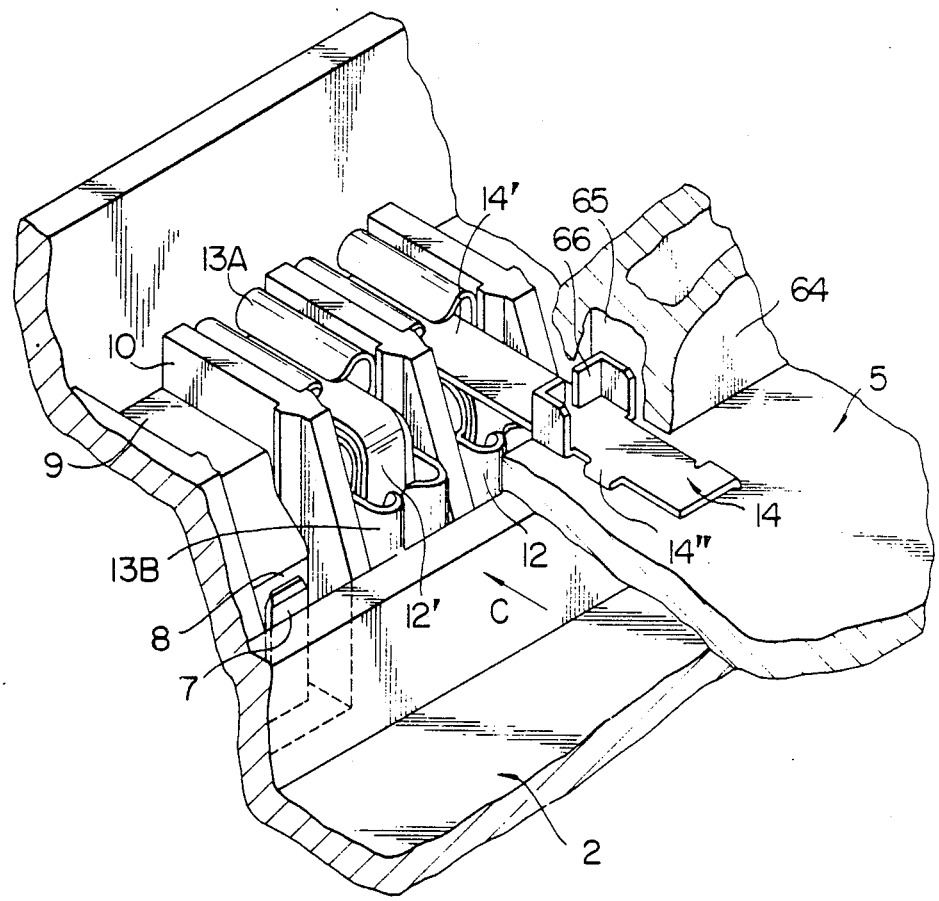
FIG. 23 is a view similar to that in FIG. 15, showing the connection between a connecting portion of a bus bar and a printed circuit board which constitutes an essential part of a seventh embodiment of the invention.

FIG. 22 shows a sixth embodiment of the invention which has a load bearing mechanism in addition to the construction of the third embodiment shown in FIG. 19.

Namely, in the sixth embodiment of the invention, a load bearing pin 39 projects from the front inner portion of the cover member 6, while a load bearing hole 34A is formed in the front side of the U-shaped terminal 14. The force generated by the insertion and withdrawal resistances can effectively be borne by the mutual engagement between the load bearing pin 39 and the bearing hole 34A. In this embodiment, the bearing pin 39 is brought into engagement with the loading bearing hole 34 upon sliding the printed circuit board 5 from the position illustrated by broken lines. To this end, the printed circuit board 5 is slidable within the cover member 6 after the mounting of the latter thereon.

As will be understood from the foregoing description, in the fourth to sixth embodiments of the invention explained in connection with FIGS. 20 to 22, the resistance generated during the mounting and demounting of the printed circuit board is effectively borne by the load bearing mechanism, so that the printed circuit board 5 and the terminals 14 on the latter are protected from the damaging and deformation even upon repeated mounting and demounting of the printed circuit board. These repeated mountings and demountings can be made in quite a smooth manner to ensure a stable long-lasting electrical function of the electrical equipments. In FIGS. 20 thru 22, the same reference numerals are used to denote the same parts or members as those used in FIGS. 13 to 19.

FIGS. 23 to 28 in combination show a seventh embodiment of the invention which is similar to the second embodiment explained before in connection with FIGS. 13 thru 18. FIGS. 23A, 24A, 25 and 26, therefore, correspond to FIGS. 15, 16, 17 and 18, respectively.

In the seventh embodiment of the invention, terminals 14 having tab-like contactors 14' are attached to the upper side of the printed circuit board 5, as in the case of the second embodiment. As will be clearly understood from a comparison between FIGS. 23 and 28A to 28W with FIG. 15, the terminal 14 in the seventh embodiment is differs from the terminal 14 in the second embodiment in that the terminal 14 of the seventh embodiment is provided at its intermediate portion with a sufficiently strong engaging tab 66 extending upright therefrom.

Figure 24A:
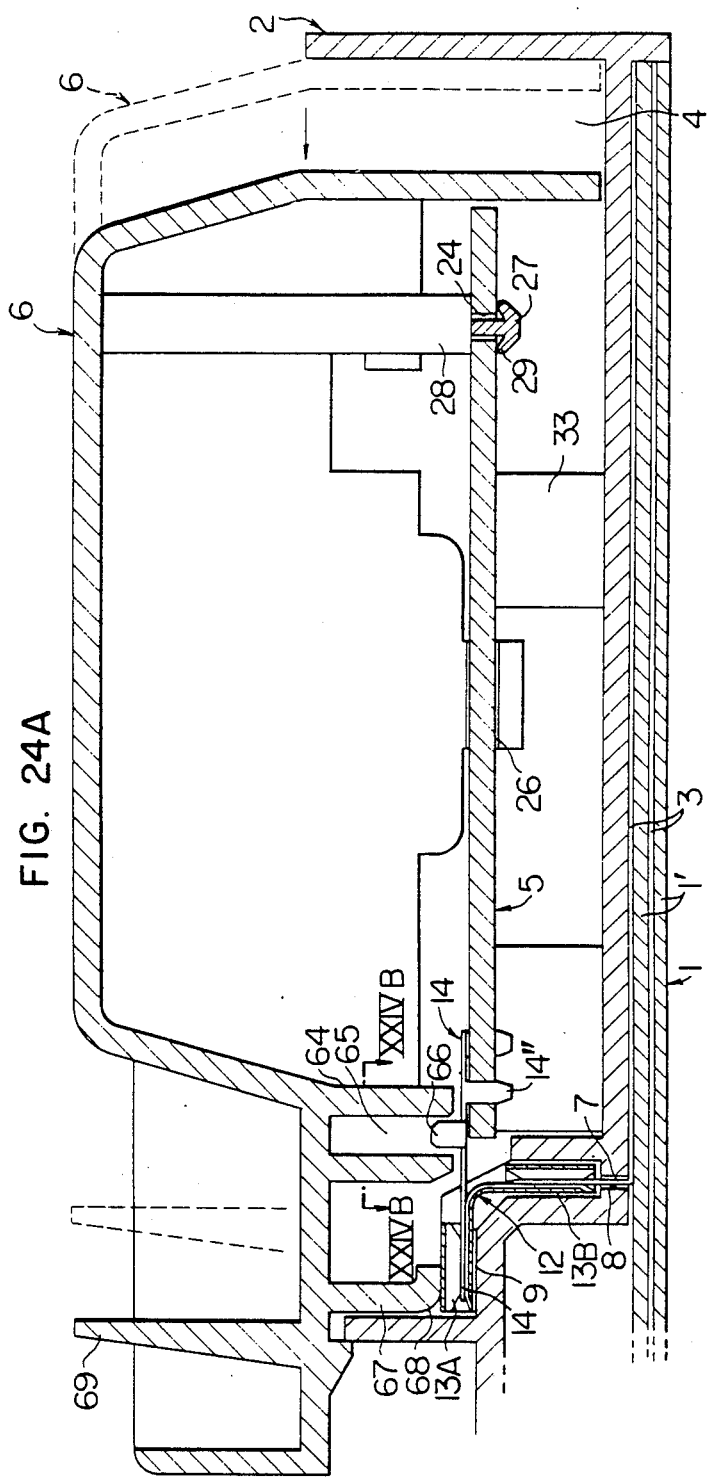
FIG. 24A is a cross-sectional view similar to that in FIG. 16, showing how a printed ciruit board and a cover member are attached to each other in the seventh embodiment of the invention.
Figure 24B:
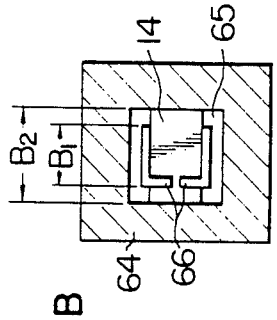
FIG. 24B is a sectional view taken along the line XXIVB—XXIVB of FIG. 24A.
Figure 25:
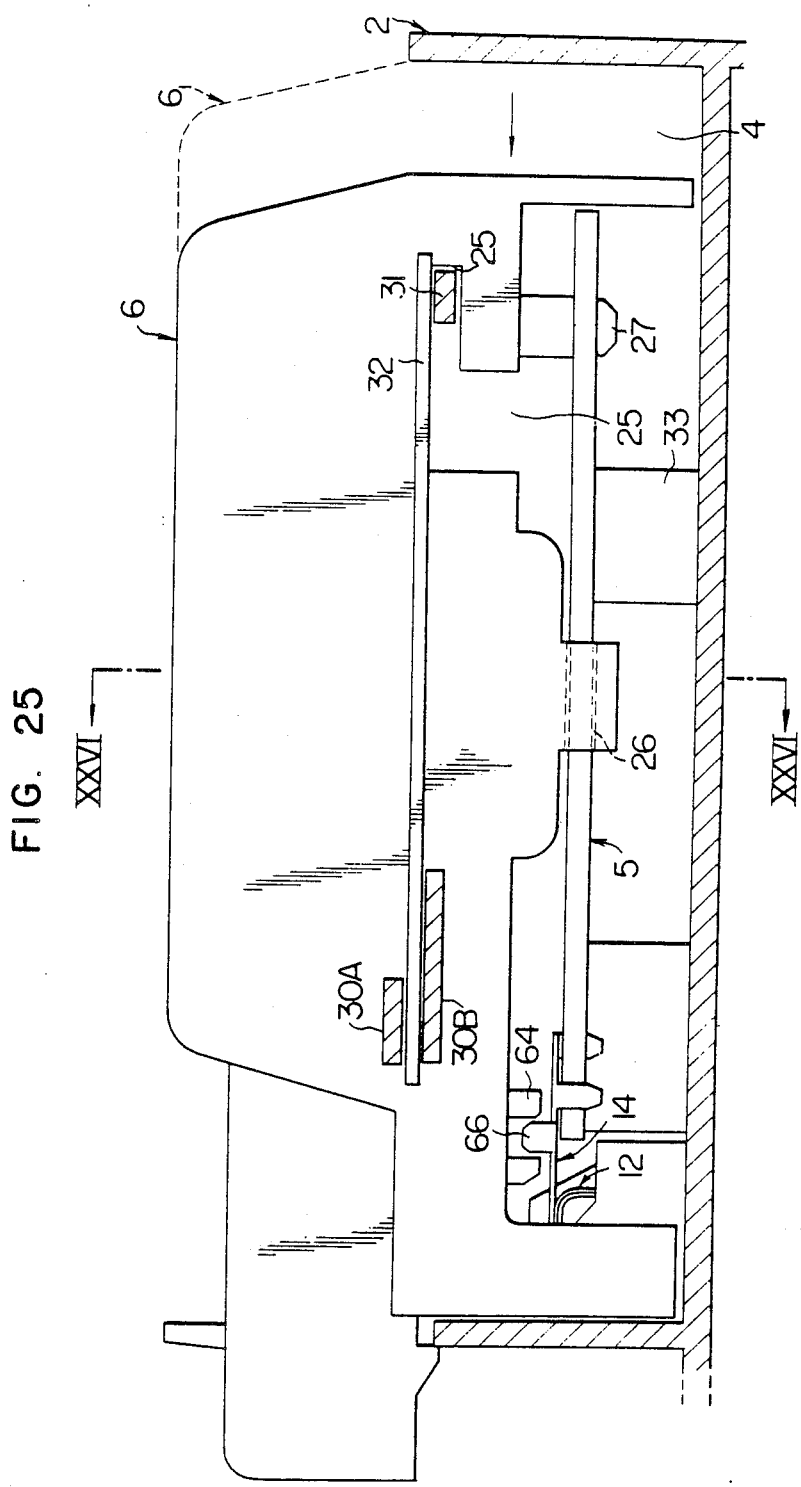
FIG. 25 is an illustration similar to that in FIG. 17, showing how a printed circuit board and a cover member are attached to each other.
Figure 26:
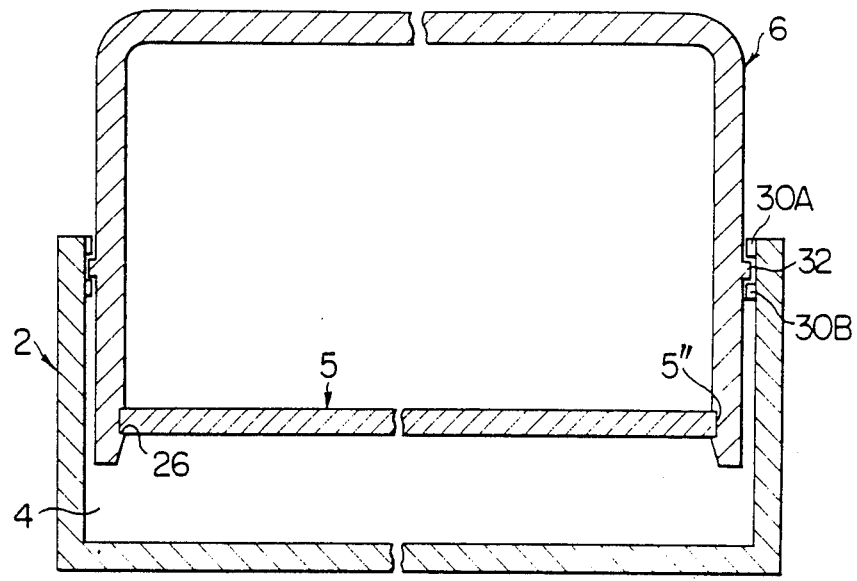
FIG. 26 is a sectional view taken along the line XXVI—XXVI of FIG. 25.
Figure 27A:
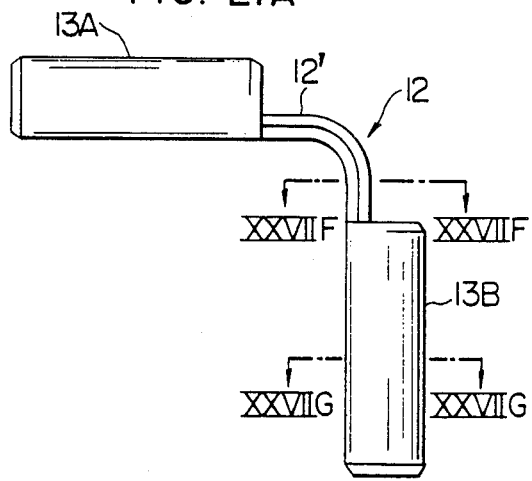
FIGS. 27A to 27E are a front elevational view, a right side elevational view, left side elevational view, top plan view and a bottom plan view, respectively, of a intermediate terminal incorporated in the seventh embodiment of the invention.
Figure 27B:
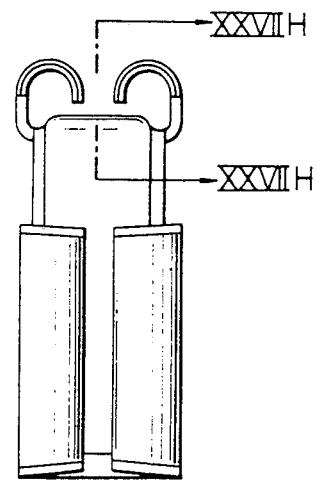
Figure 27C:
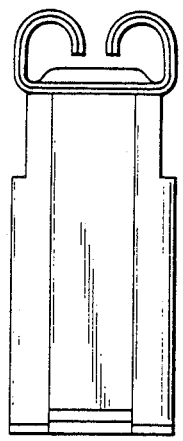
Figure 27D:
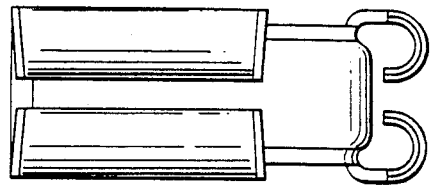
Figure 27E:
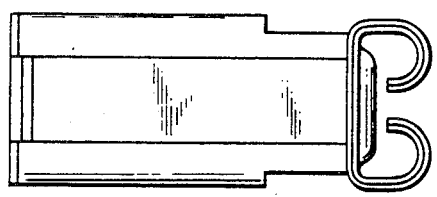
Figure 27F:
FIG. 27F is a cross-sectional view as viewed in the direction of the line XXVIIF—XXVIIF.
Figure 27G:
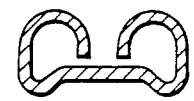
FIG. 27G is a sectional view taken along the line XXVIIG—XXVIIG of FIG. 27A.
Figure 27H:
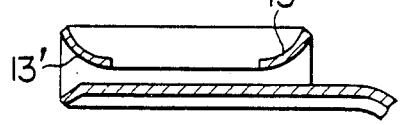
FIG. 27H is a sectional view taken along the line XXVIIH—XXVIIH of FIG. 27B.

A load bearing portion 64 is formed on the inner front portion of the cover member 6 immediately above the terminal 14. A load bearing hole 65 formed in the lower end of the bearing portion 64 is adapted to receive the tab 66 standing upright from the upper side of the intermediate portion of the terminal 14. As shown in FIG. 24B, the breadth $B_1$ of the engaging tab 66 in the front and rear directions (left and right directions as viewed in FIG. 24B) is slightly smaller than the breadth $B_2$ of the load bearing hole 65, so as to absorb any dimensional or positional error which may be incurred during the machining thereby to ensure the safe fitting of the engaging tab 66 in the load hole 65. At the same time, the gap or play between the aforementioned attaching hole 24 of the board 5 and the locking pin 27 of the cover is selected to be greater than the difference between the breadths $B_1$ and $B_2$. The engaging tab 66 and the load bearing hole 65 in combination constitute a load bearing mechanism which bears the resistance produced by the friction on the terminal 14 during mounting and demounting of the printed circuit board. A guide tab 67 formed on the front inner side of the cover member 6 is adapted to contact the upper edge of the intermediate terminal 12 when the printed circuit board 5 with the cover member 6 is correctly secured to the wiring board 1. The guide tab 67 has a curved guide edge 68 at the front lower side thereof for correctly positioning and guiding the intermediate terminal 12 during the mounting and demounting of the printed circuit board 5. A retaining tab 69 formed on the frontmost portion of the cover member 6 functions a locking tab that is adapted to engage a wall of the case member 2 to stabilize the printed circuit board 5 after the mounting thereof.

The portions of the seventh embodiment other than those described above are materially identical to those of the second embodiment. Therefore, in FIGS. 23 to 28, the same reference numerals are used to denote the same parts or members as those in FIGS. 13 to 18.

It will be understood that the mounting of the printed circuit board 5 with the cover member 6 attached can be done in the same manner as that in the second embodiment. Namely, the printed circuit board 5 with the cover member 6 attached thereto is put into the recess 4 closely to the rear end of the latter as shown by broken lines in FIG. 25. Then, after inserting the holding tab 31 in the opening 25, the printed circuit board is slided forwardly as indicated by the arrow. In consequence, the engaging protrusions 32 are received by the gap between the holding tabs 30A and 30B, while the holding tab 31 is received by the slit 25'. In this state, the cover member 6 makes contact with the inner surface of the recess 4 without any play in the lateral directions. Needless to say, the printed circuit board 5 can easily be demounted from the wiring board 1 by taking the reverse procedure, for the purpose of protective maintenance and inspection of the function parts 22.

During the mounting and demounting of the printed circuit board, the load bearing portion 64, guide tab 67 and other members function in a manner explained hereinunder. Namely, the tab-like contactor 14' of the terminal 14 is guided by the curved surface of the intermediate terminal 12. If the intermediate terminal 12 is positioned above the receiving seat 9 due to incorrect shape thereof or inferior mounting, it is forcibly corrected by the curved edge 68 of the guide tab 67 of the cover member 6 which slides forwardly from the rear side, so that the intermediate terminal 12 is smoothly and safely connected to the terminal 14.

If the resistance is increased in the initial period of the connection between the intermediate terminals 12 and the terminals 14, the printed circuit board 5 is moved rearwardly in the cover member 6 only by a distance equal to the gap or play between the engaging tab 66 and the load bearing hole 65. Then, as the load bearing hole 65 is brought into engagement with the engaging tab 66, the resistance is born by the load portion 64 so that no substantial force is applied to the legs 14" of the terminals 14 contacting the printed circuit board 5 nor to the solder by which the legs are fixed to the printed circuit board. Clearly, the resistance produced when the printed circuit board 5 is withdrawn also is borne by the load portion 64.

As has been described, in the seventh embodiment of the invention, the printed circuit board 5 and the terminals 14 attached on the same are protected against any damaging or deforming force, partly because the intermediate terminal 12 is guided and corrected by the guide tab 67 and partly because the resistance generated during the mounting and demounting of the printed circuit board is borne by the load bearing mechanism, so as to permit a smooth repetitional mounting and demounting while ensuring long-lasting and stable functioning of the electric equipment.

FIGS. 27A to 27H show the detail of the intermediate terminal 12 incorporated in the seventh embodiment. As will be clearly seen from these Figures, the intermediate terminal 12 is a substantially L-shaped terminal having a substrate 12' which is bent at its mid portion at 90° with a small curvature and a pair of receptacle-like contactors 13A and 13B at both sides of the bent portion each adapted to receive the tab-like contactors. In the illustrated embodiment, both side edges of the substrate are reversely bent through 180° to form curled portions to receive the contactors. The lower edge of the reversely bent sides have curved edges 13' at both longitudinal ends thereof. As in the case of the arrangement shown in FIG. 23, the lower contactors 13B is fitted to the tab-like contactors 7 of the end of the bus bar 3 that projects upwardly through the through hole 8. The upper contactor 13A rests in the receiving seat 9 defined by the walls 10. Then, the printed circuit board 5 is inserted in the direction of the arrow C (FIG. 23) so that the tab-like contactors 14' of the terminals 14 on the front edge 5' of the printed circuit board 5 are connected to the contactors 13A of the intermediate terminals 12. The intermediate terminals 12 shown in FIGS. 27A to 27H are materially identical to that incorporated in the second embodiment.

Figure 29:
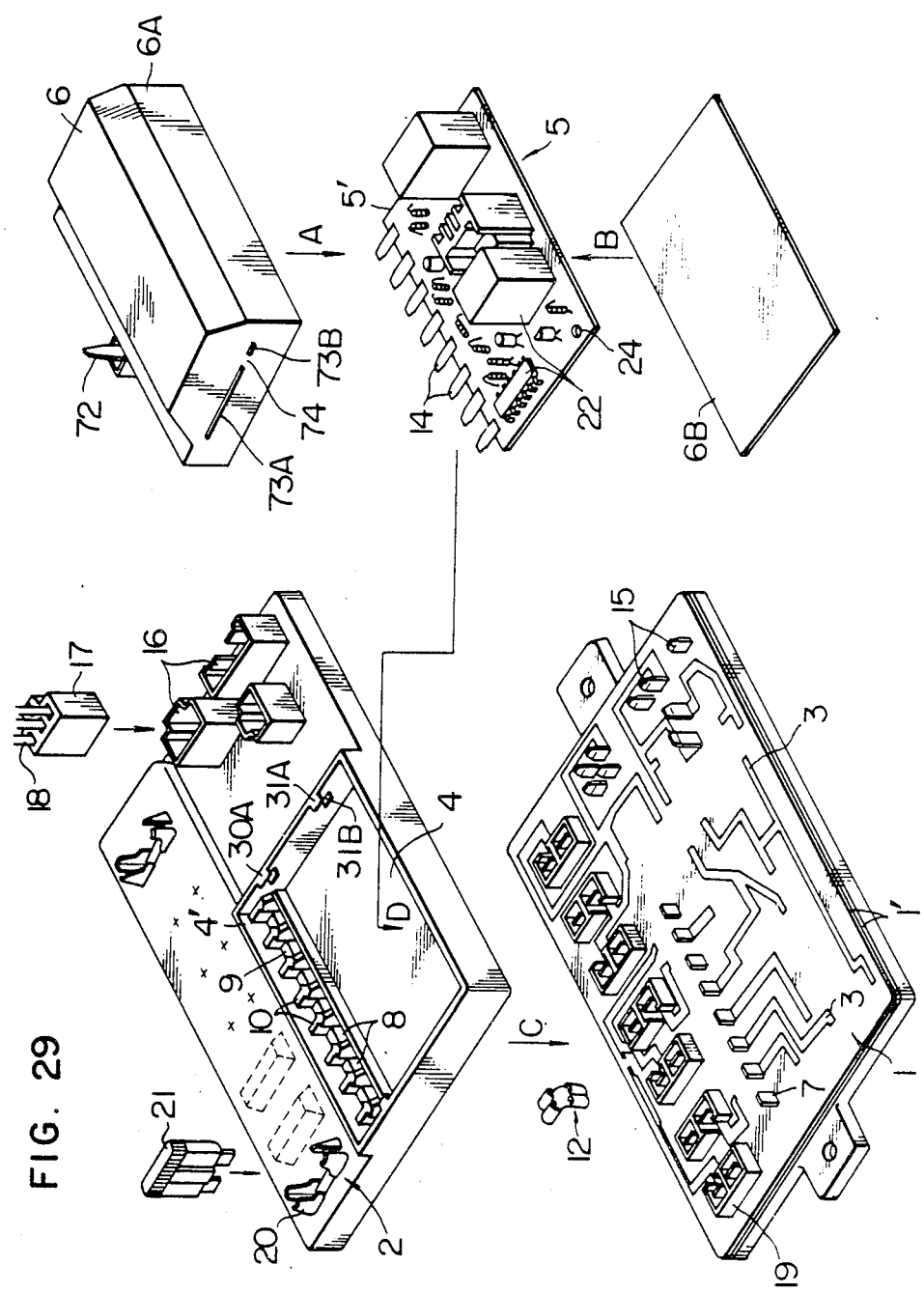
FIG. 29 is an exploded perspective view showing the whole part of an eighth embodiment of the electrical junction system of the invention.
Figure 30:
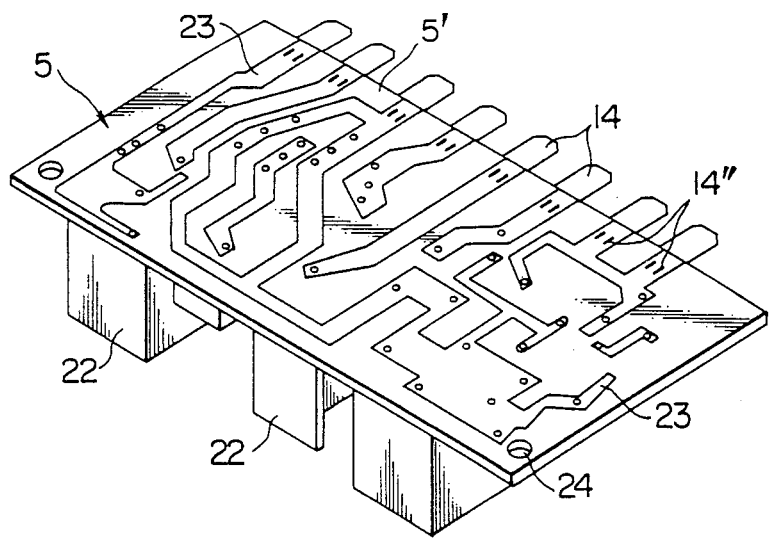
FIG. 30 is a perspective view of the reverse side of a printed circuit board shown in FIG. 29.

FIGS. 29 to 33 show an eighth embodiment of an electrical junction system constructed according to the invention. As shown in FIG. 29, this embodiment has a wiring board 1 having a laminated structure consisting of a plurality of insulation plates 1' each carrying known bus bars arranged to form branching circuits corresponding to the branching circuits of the wiring harness. A case member 2 covers the wiring board and a printed circuit board 5 is attached to the wiring board 1 and carries circuits having functional elements. The terminals of the circuits of the board 5 are arrayed at one side and a housing member 6 houses the printed circuit board 5. The housing member is compressed of a cover 6A covering the upper and lateral sides of the printed circuit board 5 and a bottom plate 6B. The printed circuit board 5 is received by the housing member 6 as indicated by arrows A and B to form an independent body. Then, the case member 2 is attached to the wiring board 1 as indicated by arrows C and D. Subsequently, the housing member 6 accommodating the printed circuit board 5 is mounted in the rectangular recess 4 formed in the case member 2, thereby to achieve electrical connection between the conductors on the printed circuit board 5 and the ends of the bus bars 3.

Figure 31:
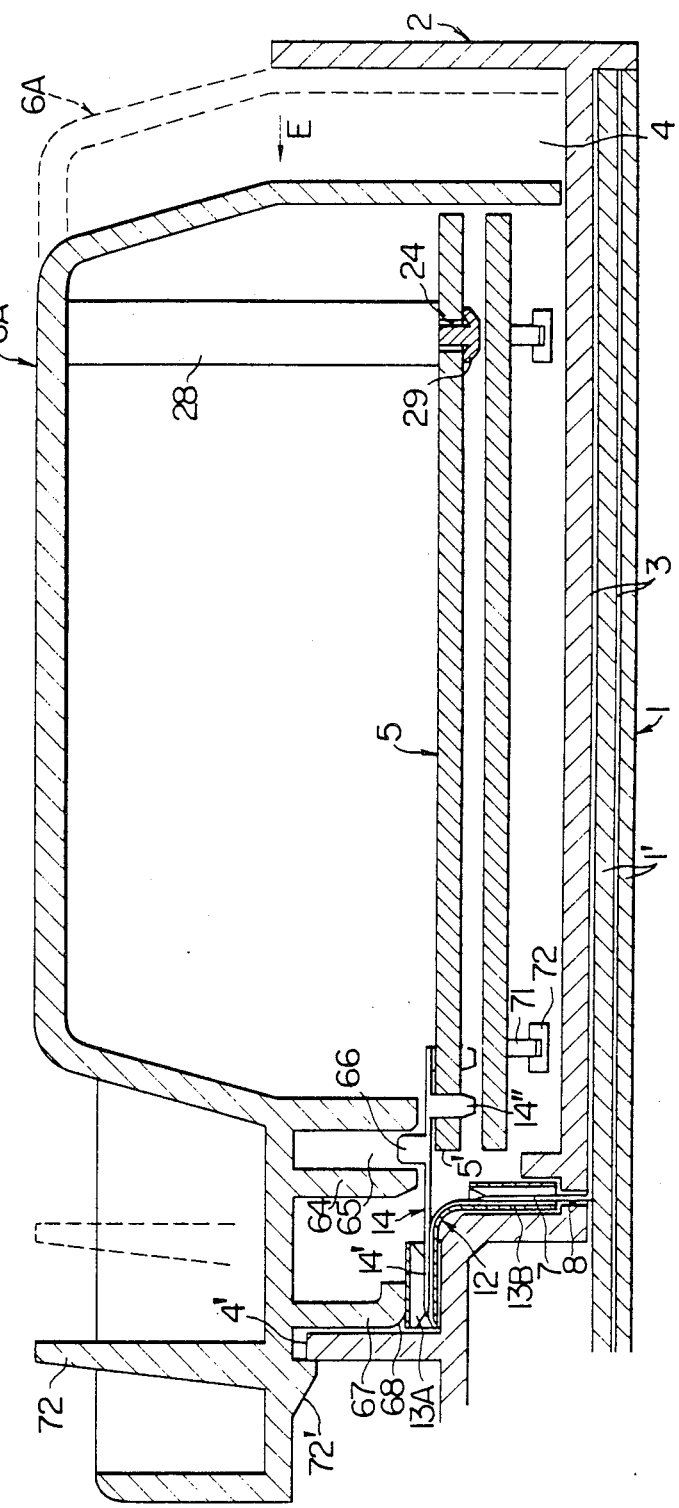
FIG. 31 is a vertical sectional view of the eighth embodiment showing how the printed circuit board is accomodated and showing how the housing member is mounted in a recess.

More specifically, the ends of the bus bars 3 which are to be connected to the required functional parts are shaped into the form of upright tab-like contactors 7 which are arrayed in a concentrated manner along a line on an intermediate portion of the wiring board 1. These tab-like contactors 7 project upwardly through slit-like through holes 8 formed at the bottom of the recess 4 in the case member 2 at positions corresponding to the tab-like contactors 7, when the latter is fitted to the wiring board 1. In addition, intermediate receiving seats 9 are defined above the through holes 8 by walls 10. Each receiving seat 9 is adapted to receive an intermediate terminal 12. As shown in FIG. 31, the intermediate terminal 12 is an L-shaped female terminal which is bent at its mid portion at 90° and provided with receptacle-like contactors 13A, 13B at both sides of the central bend each of which receives a respective tab-like contactor. The lower contactor 13B fits around the tab-like contactor 7 projecting through the hole 8 while the upper contactor 13A is received by the receiving seat 9 defined by the walls 10. The arrangement is such that the printed circuit board 5 is slided rearwardly to bring the tab-like contactors 14' of the terminals 14 arrayed on the front edge 5' of the printed circuit board 5 into engagement and electrical contact with the contactors 13A. The reference numerals 15 appearing in FIG. 29 denote tab-like contactors on the ends of the bus bars 3 adapted to be connected to the wires 18 of the wiring harness. These tab-like contactors 15 are housed, when the case member 2 is attached, by connection ports 16 which are formed in a concentrated manner at a corner of the case body 2. Then, connectors 17 connected to the end of the wires 18 are inserted into the connecting ports 16 so as to attain electric connection between the wires 18 and the bus bars 3. The reference numerals 19 designate fuse holders for holding fuses which are used in the protection of respective branch circuits. These fuse holders are received in recesses 20 formed in the case member 2. Bifurcated fuses 21 are inserted into respective fuse holders from the upper side thereof.

The printed circuit board 5 densely carries all of the functional parts such as relays, diodes, capacitors and so forth required by the branch circuits of the wiring harnesses. As will be seen from FIG. 30, conductors 23 for respective functional parts are printed on the reverse side of the printed circuit board 5. The ends of the conductors 23 are arrayed along one side edge 5' of the printed circuit board 5 at a suitable interval to take positions precisely corresponding to the tab-like contactors 7 on the wiring board when the printed circuit board 5 is mounted on the wiring board 1.

As shown in FIG. 31, terminals 14 having tab-like contactors 14' for connection to the intermediate terminals 12 are mounted on the upper side of the printed circuit board 5. Each terminal 14 has legs 14" at its base portion at which it are electrically connected and fixed by soldering to corresponding conductor 23 on the reverse side of the printed circuit board. The tab-like contactors 14' project from the front edge 5'.

Figure 32:
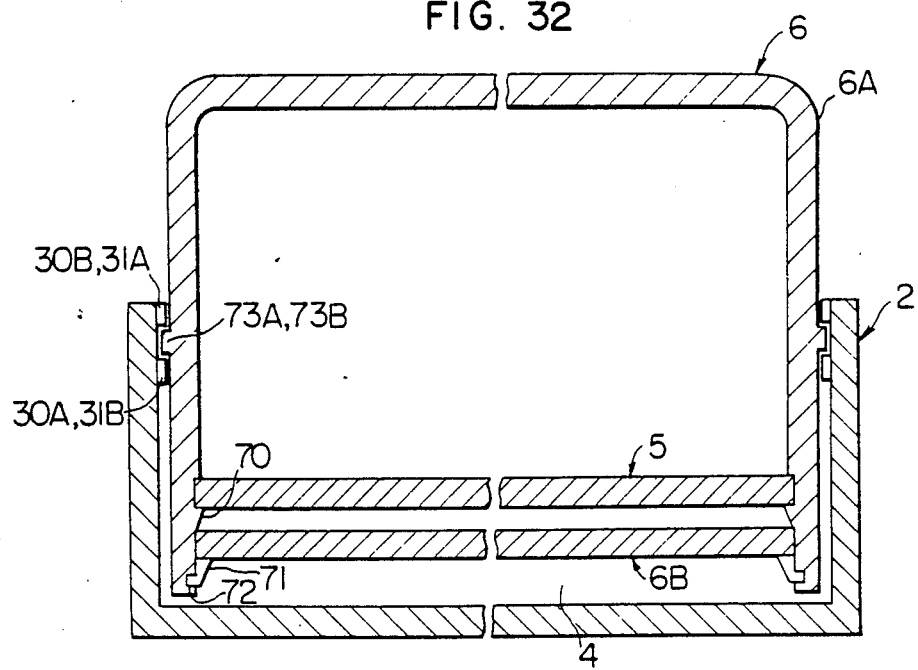
FIG. 32 is a cross-sectional view of the portion of the eighth embodiment shown in FIG. 31.

As stated before, the printed circuit board 5 is housed by a housing member 6 consisting of a cover 6A which covers the upper and lateral sides of the printed circuit board 5 including the ends of the terminals 14 and a bottom plate 6B which closes the lower side of the cover member 6A. The printed circuit board 5 is housed by the housing member 6 leaving only a slit-like opening for connection with the intermediate terminals 12 ahead of the terminals 14. More specifically, as shown in FIGS. 31 and 32, a retaining claw 70 is formed on the inner lower side of the cover member 6A. As the cover member 6A is lightly pressed onto the printed circuit board 5 from the upper side thereof, the lower surface of the printed circuit board 5 is brought into engagement with the retaining claw 70 and the parts may be snapped together so that the cover member 6A is secured to the printed circuit board 5. Then, the bottom plate 6B is fitted from the lower side of the cover member 6A so that small resilient tabs 71 provided on the periphery of the bottom plate 6B are received in retaining recesses 72 formed in the walls of the cover member 6A near the lower edges thereof so that the bottom plate 6B is held securely to extend in parallel with the printed wiring board 5 in the vicinity of the latter so as to close the lower opening of the cover member 6A. Thus, the printed circuit board 5 is housed by the housing member 6 such that the upper and lateral sides of the functional parts 22 and the terminals 14 are covered by the cover member 6A and that the lower side thereof is also closed by the bottom plate 6B.

In the described construction for containment of the printed circuit board, the position or posture of the printed circuit board 5 is stabilized by means of locking pins 29 which extend through attaching holes 24 in the printed circuit board 5 and which are adapted to fix the base portion to bosses 28 of the cover member 6A. At the same time, a retainer tab 72 is formed at the front side of the cover member 6A. The arrangement is such that, as the housing member 6 accommodating the printed circuit board 5 is mounted in the recess 4 in the case member 2, the housing member 6 is locked through mutual engagement between the upper edge of the front wall 4' of the recess 4 and a locking claw 72' on the lower end of the retainer tab 72.

Two pairs of holding tabs 30A,30B and 31A,31B, the tabs of each pair being spaced vertically, are formed on the inner surfaces of the side walls of the recess 4. These tabs are formed as protrusions having certain lengths in the back and forth directions and which extend substantially parallel with the wiring board 1. In addition, engaging protrusions 73A and 73B are formed on the outer surfaces of both side walls of the cover member 6A and extend in the direction parallel to the plane of the printed circuit board 5 received in the cover member 6A. These engaging protrusions are adapted to be introduced into the gaps between the holding tabs 30A and 30B and 31A and 31B of the corresponding pair. A notch 74 for loosely receiving a holding tab 31A is formed between the engaging protrusions 73A and 73B.

Figure 33:
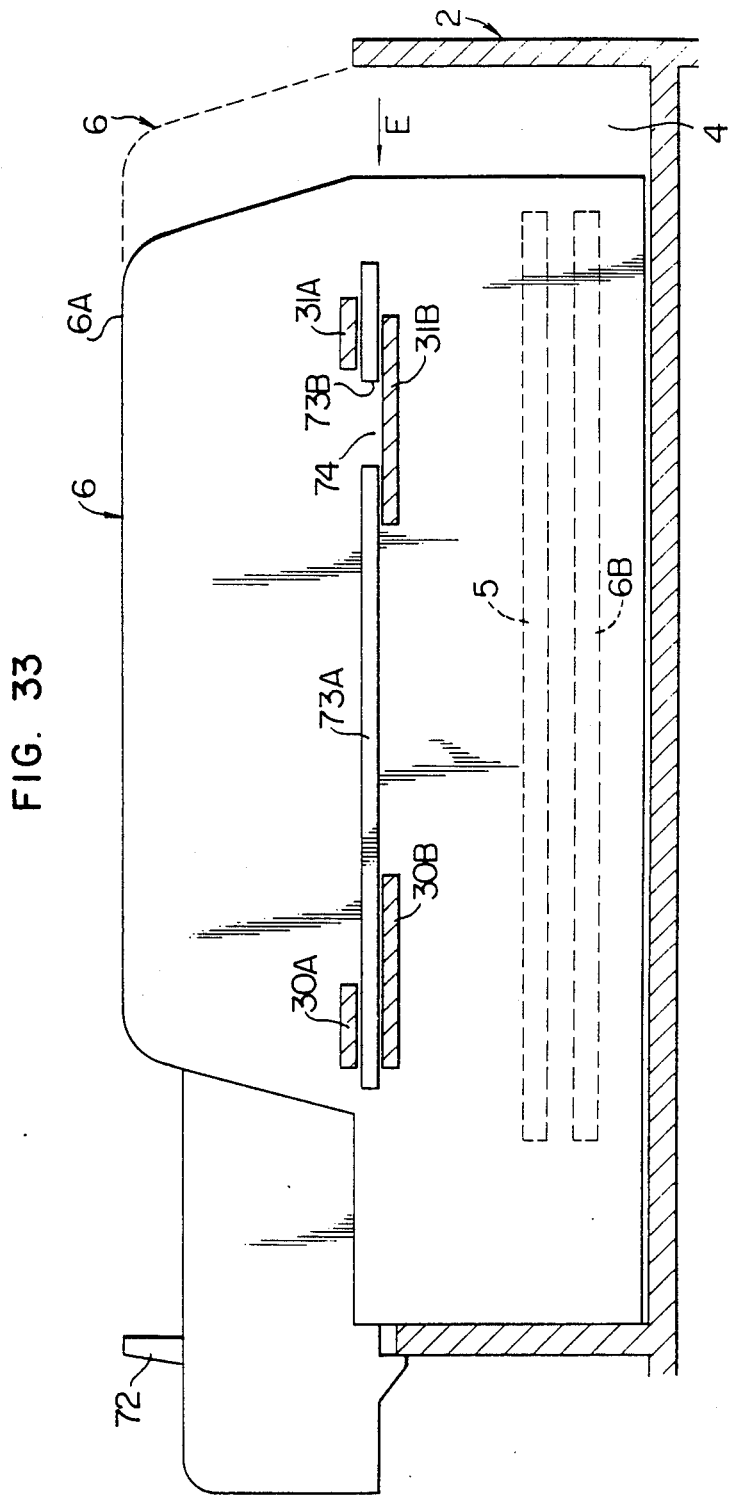
FIG. 33 is a vertical sectional view showing how the housing member engages the recess.

In assembling, the housing member 6 accommodating the printed circuit board 5 is inserted to the rear portion of the recess 4 from the upper side of the latter as illustrated by broken lines in FIG. 33 with the holding tab 31A loosely received by the notch 74 and is then slided slightly in the forward direction as indicated by an arrow E so as to introduce the engaging protrusions 73A and 73B into the gaps between the holding tabs 30A and 30B and between 31A and 31B thereby to attain a close fit therebetween. Then, the printed circuit board 5 is moved on the printed circuit board 1 in parallel with the latter thereby to complete the mounting of the printed circuit board. As a result of the forward sliding movement of the printed circuit board, the tab-like contactors 14' of the terminals 14 are inserted into the receptacle-like contactors 13A of the intermediate terminals 12 so that the functional part circuits on the printed circuit board 5 are electrically connected to corresponding branch circuits formed on the wiring board by the bus bars 3. By taking the reverse procedure, the printed circuit board 5 can easily be demounted from the recess 4 in the wiring board 1 and detached from the housing member 6 for maintenance or inspection purpose.

In the housing member 6 explained hereinabaove, the cover member 6A is provided at its front inner side thereof with a load bearing mechanism for bearing the resistance encountered during connecting and disconnecting the terminals 14 and the intermediate terminals 12 to and from each other, as well as a guide mechanism, in order to attain a smooth connecting and disconnecting operation.

More specifically, the cover 6A is provided at the inner side of the front portion thereof with load bearing portions 64 and guide tabs 67 suspended therefrom. The load bearing portions 64 are provided at its lower end with bearing holes 65 which are adapted to receive engaging tabs 66 protruded from the terminals 14. At the same time, the printed circuit board 5 is movable slightly in the back and forth directions within the cover member 6A by, for example, a loose fit of the lock pins 29 in the attaching holes 24. The force which is generated by frictional resistance when the terminals 14 are brought into and out of engagement with the intermediate terminals 12 is born by the load bearing portions 64 so that no substantial force is applied to the weak legs 14" of the terminals nor to the printed circuit board 5 itself.

The aforementioned guide tabs 67 provided on the front inner side of the cover member 6A are adapted to contact the upper edge of the intermediate terminals 12 when the printed circuit board 5 is correctly positioned in the wiring board 1. The guide tabs 67 are provided at their front lower sides with curved edges 68 which are adapted to contact, if the respective intermediate terminal beforehand mounted is displaced for any reason, the intermediate terminal 12 to correct its position when the printed circuit board 5 is slided to the mounting position, thereby to ensure smooth connection and disconnection between the terminals.

In the eighth embodiment described hereinbefore, the connecting means for connecting the cover 6A and the bottom plate 6B of the housing body 6 can be modified in various ways.

Figure 34:
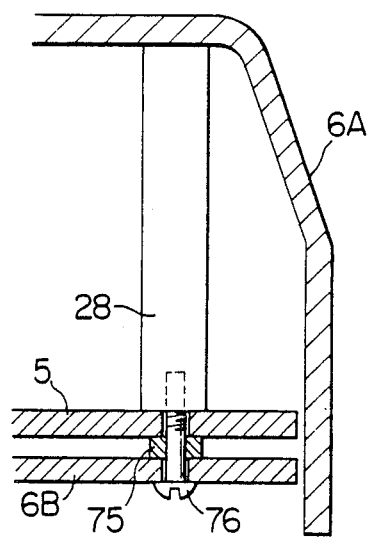
FIG. 34 is a cross-sectional view showing another embodiment for connecting the cover to the bottom plate in the eighth embodiment of the invention.
Figure 36:
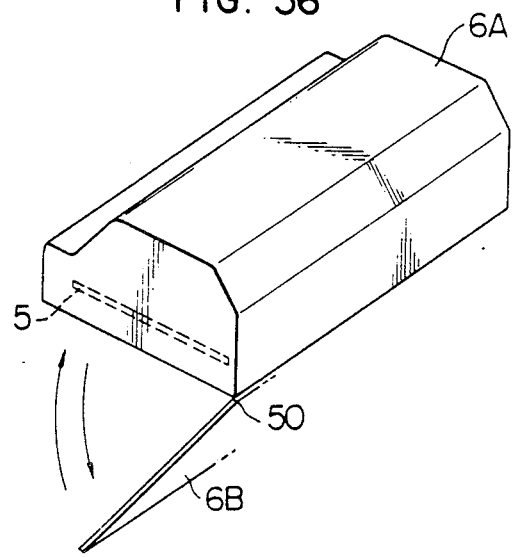
FIG. 36 is a perspective view showing a further modification of method for connecting the cover member to the bottom plate in the eighth embodiment.
Figure 35:
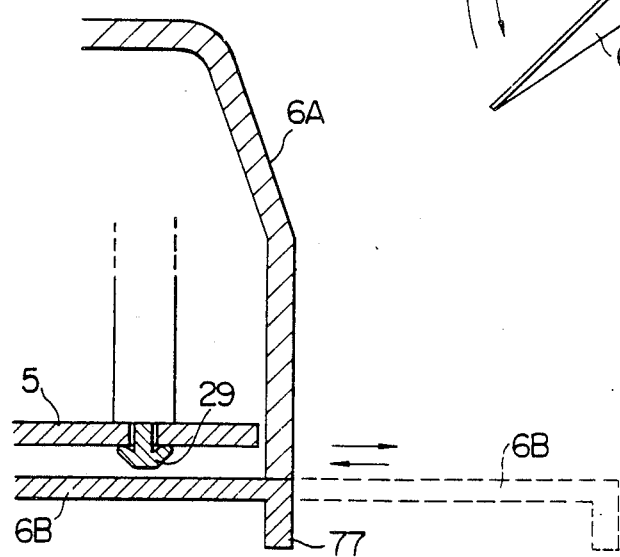
FIG. 35 is a cross-sectional view showing another modification of means for connecting the cover member to the bottom plate in the eighth embodiment.

FIGS. 34 to 36 show examples of such modifications of the connecting means between the housing and the printed circuit board. In the connecting means shown in FIG. 34, the bottom plate 6B is secured by means of bolts 76 to the boss portions 28 of the cover member 6A with spacers 75 positioned between the printed circuit board 5 and the bottom plate 6B.

In the arrangement shown in FIG. 35, both side edges of the bottom plate 6B are fitted in grooves (not shown) in the left and right side walls of the cover member 6A so that the bottom plate 6B is adapted to be slid from the near end of the cover member 6A as shown by the broken lines and arrows along the grooves so as to close the lower opening in the cover member 6A. In FIG. 35, a reference numeral 77 designates a skirt portion formed on the bottom plate.

In the arrangement shown in FIG. 36, the cover member 6A and the bottom plate 6B are connected pivotally to each other through a hinge 50. In the closed state, the bottom plate 6B is retained in a suitable manner by the lower edge of the cover 6A.

As will be understood from the above explanation, any bottom plate can be selected from those illustrated or other known ones, for forming, in cooperation with the cover 6A, the housing member 6 which accommodates the printed circuit board.

Figure 37:
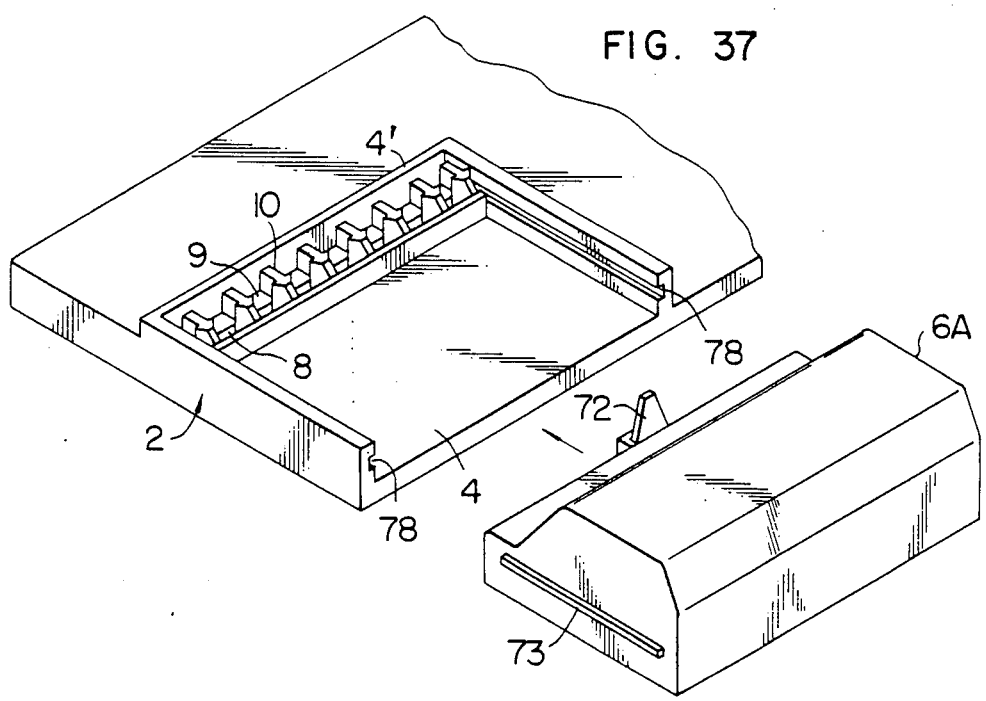
FIG. 37 is a perspective view of another modification of the eight embodiment of the invention.
Figure 38:
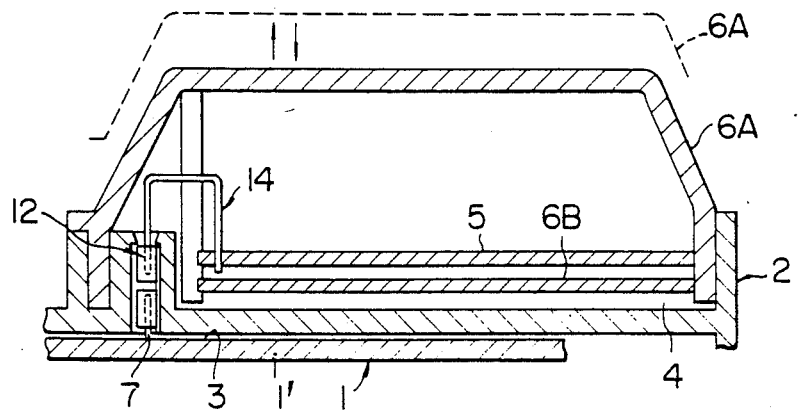
FIG. 38 is a cross-sectional view showing a still further modification of the eighth embodiment.

FIGS. 37 and 38 show modifications of the eighth embodiment explained hereinbefore. Referring first to FIG. 37, engaging grooves 78 formed in the inner sides of both side walls of the recess 4 extend in the back and forth directions and are adapted to receive engaging protrusions 73 formed on both side walls of the cover 6A. In this case, the housing member 6 is inserted into the recess 4 from the rear side of the latter and is slided further to the designated mounting position.

In the modification shown in FIG. 38, the housing member 6 is adapted to be mounted in and demounted from the recess 4 by downward and upward vertical movements. To this end, U-shaped terminals 14 having tab-like contactors 14' confronting the wiring board 12 are arranged on the front end edge 5' of the printed circuit board 5. Intermediate terminals 1 secured to the tab-like contactors 7 of the bus bars 3. The intermediate terminals 12 are provided at their upper and lower ends with receptacle-like contactors for receiving the contactors 14' and 7. The arrangement is such that the electrical connection between the terminals 14 and the tab-like contactors 7 is achieved through the intermediate connectors 12 as the housing member 6 having the terminals 14 is moved downwardly. The housing member 6 may be provided with one or more ventilation holes or windows. In FIGS. 29 to 38, the same reference numerals are used to denote the same parts or members.

As has been described, in the eighth embodiment of the electrical junction system of the invention, the printed circuit board arranged at its one side with terminals contained with a housing member mounted on the wiring board through the medium of the housing member. Therefore, the terminals are required to carry only the electrical connecting function and are not required to possess physical strength for attaining mechanical stability of mounting. This advantageously permits a single printed circuit board to carry quite a large number of terminals.

In consequence, it becomes possible to arrange on, for example a single printed circuit board, all of the functional parts necessitated by the branching circuits of the wire harness in a concentrated manner at a high density, thereby to save the installation space. Accordingly, it is possible to produce an electrical junction system of an extremely small size, well meeting the requirements such as increasing in the number of the functional parts, upgrading and complication of the branch circuits and so forth to cope with the current demand for upgrading of automobiles, while satisfying the requirement from the restriction in the installation space.

It is to be noted also that the electrical junction system of the invention having a simple construction promotes a diversification of the production process and the adoption of automation, which in turn improves the productivity. Furthermore, it is possible to attain a highly smooth repetitional connection and disconnection of terminals resulting in a stable long-lasting electric function of the functional parts, thanks to the use of the housing member which is provided with a guide mechanism for guiding the terminals during connecting and disconnecting operation, as well as the load bearing mechanism which bears the force generated by the friction between the terminals when they are connected and disconnected to and from each other.

The terminals, functional parts and printed conductors on the printed circuit are generally weak mechanically and, hence are liable to be damaged or distorted as a result of contact with other parts, when the printed circuit board is shifted transported or handled as a new part for replacement. According to the invention, this problem can be overcome satisfactorily because the housing member conceals and protects the terminals, functional parts and printed conductors on the printed circuit board to permit the latter to be treated as a protected unit part, to a great advantage in the practical use.

As has been described, according to the invention, it is possible to obtain a useful electric junction system which well meets the current demand for upgrading of automobiles.

Although the invention has been described through specific terms, it is to be noted here that the described embodiments are only illustrative and various changes and modifications may be imparted thereto without departing from the scope of the invention which is limited solely by the appended claims.

What is claimed is:

1. An electrical junction system comprising a wiring board carrying a plurality of bus bar conductors each having an end extending upwardly therefrom, a case member covering the upper side of said wiring board and having holes into respective ones of which the ends of said bus bar conductors project with said case member covering said wiring board, said case member also having terminal receiving seats adjacent to the respective upright holes and extending substantially horizontally, a printed circuit board carrying functional parts and having one side edge from which a plurality of tab-like contactors project in side-by-side relationship, each of said tab-like contactors having at a longitudinally intermediate portion thereof an engaging tab extending upright therefrom, a cover member affixed to the circuit board and covering and protecting said functional parts, said cover member having a load bearing hole receiving said engaging tabs of said tab-like contactors and bearing the adjacent portion of said tab-like contactors upon the occurrence of horizontal relative displacement between said cover member and said tab-like contactors, intermediate terminals each having a substrate bent into L-shape and receptacle-like contactors provided at both ends of said substrate, one of said receptacle-like contactors of each of said intermediate terminals being fitted into a corresponding hole in said case member to contact with the end of the bus bar conductor projecting thereinto, the other receptacle-like contactor being supported on the corresponding terminal receiving seat of said case member, said tab-like contactors of said circuit board being inserted into said other receptacle-like contactors to establish contact therebetween upon sliding of said circuit board horizontally.

* * * * *